United States Patent
Kondo et al.

(10) Patent No.: US 6,737,123 B2
(45) Date of Patent: May 18, 2004

(54) SILICON-BASED FILM FORMATION PROCESS, SILICON-BASED FILM, SEMICONDUCTOR DEVICE, AND SILICON-BASED FILM FORMATION SYSTEM

(75) Inventors: Takaharu Kondo, Kyoto (JP); Masafumi Sano, Kyoto (JP); Akira Sakai, Kyoto (JP); Tadashi Sawayama, Kyoto (JP); Ryo Hayashi, Nara (JP); Shuichiro Sugiyama, Kyoto (JP); Hiroyuki Ozaki, Kyoto (JP); Yoshinori Sugiura, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 10/166,759

(22) Filed: Jun. 12, 2002

(65) Prior Publication Data
US 2003/0143822 A1 Jul. 31, 2003

(30) Foreign Application Priority Data
Jun. 14, 2001 (JP) ........................ 2001-180885

(51) Int. Cl.[7] ...................... C23C 16/505; C23C 16/52; C23C 16/24
(52) U.S. Cl. .................. 427/585; 136/258; 136/255; 136/249; 136/261; 257/458; 257/52; 257/53; 257/57; 438/96; 438/97; 438/153; 438/154; 427/588; 427/74; 427/58; 118/723 R; 118/723 I; 118/723 E
(58) Field of Search ................. 136/258, 255, 136/249, 261; 257/458, 52, 53, 57; 438/96, 97, 153, 154; 427/585, 588, 74, 58; 118/723 R, 723 I, 723 E

(56) References Cited

U.S. PATENT DOCUMENTS

| | | | |
|---|---|---|---|
| 4,634,601 A | * 1/1987 | Hamakawa et al. | ........ 438/485 |
| 4,933,203 A | 6/1990 | Curtins | ........ 438/485 |
| 5,582,880 A | * 12/1996 | Moshizuki et al. | ......... 427/569 |
| 5,927,994 A | 7/1999 | Kohda et al. | ................. 438/478 |
| 6,054,024 A | 4/2000 | Toyama et al. | ......... 204/192.29 |
| 6,100,466 A | * 8/2000 | Nishimoto | .................. 136/258 |
| 6,337,224 B1 | 1/2002 | Okamoto et al. | ............. 438/69 |
| 6,488,995 B1 | * 12/2002 | Nishimoto et al. | ......... 427/575 |
| 6,525,341 B1 | * 2/2003 | Tsujimura et al. | ............ 257/59 |

FOREIGN PATENT DOCUMENTS

| | | | |
|---|---|---|---|
| EP | 977246 A2 | * 2/2000 | |
| JP | 06-97078 | 4/1994 | ........ H01L/21/205 |
| JP | 07-105354 | 11/1995 | ........ H01L/21/205 |
| JP | 11-330520 | 11/1999 | ........... H01L/31/04 |
| JP | 2001-77366 A | * 3/2001 | |

OTHER PUBLICATIONS

"Basic Photovoltaic Principles and Methods," Solar Energy Research Institute, pp. 90–92, (1984).*
English translation JP 06–9708 dated Apr. 1994.
English translation of JP11–330520 dated Nov. 1999.

* cited by examiner

*Primary Examiner*—Alan Diamond
(74) *Attorney, Agent, or Firm*—Fitzpatrick, Cella, Harper & Scinto

(57) ABSTRACT

A silicon-based film is formed superimposing a direct-current potential on the high-frequency power to set the potential of the high-frequency power feed section to a potential which is lower by V1 than the ground potential; the V1 satisfying $|V2| \leq |V1| \leq 50 \times |V2|$, where V2 is the potential difference from the ground potential, produced in the electrode in the state the plasma has taken place under the same conditions except that the direct-current potential is not superposed on the high-frequency power and the electrode is brought into a non-grounded state. This can provide a silicon-based film having superior characteristics at a high film formation rate, and a semiconductor device making use of this silicon-based film, having superior adherence, environmental resistance, and can enjoy a short tact time at the time of manufacture.

22 Claims, 5 Drawing Sheets

SILICON-BASED FILM FORMATION PROCESS, SILICON-BASED FILM, SEMICONDUCTOR DEVICE, AND SILICON-BASED FILM FORMATION SYSTEM

BACKGROUND OF THE INVENTION

1. Field of the Invention

This invention relates to a process of forming a silicon-based film (a film which comprises silicon), a silicon-based film, a semiconductor device having a semiconductor junction formed of a silicon-based film, and a system for forming a silicon-based film.

2. Related Background Art

High-frequency plasma CVD (chemical vapor deposition) enables large-area film formation and low-temperature film formation with ease and brings about an improvement in process throughput. Accordingly, this is one of means which are reliable for the mass production of silicon-based films.

As semiconductor devices having semiconductor junctions formed of silicon-based films, think about solar cells for example. Compared with the existing energy which utilizes fossil fuel, solar cells making use of silicon-based films have an advantage that the energy source is limitless and an advantage that their electricity generation process is clean.

However, in order to more advance the spread of solar cells, the unit price per electrical quantity (electric energy) of generated electricity must be more lowered. For this end, the rate of film formation in the high-frequency plasma CVD must be improved and also the photoelectric conversion efficiency must be enhanced. How a technique for achieving these be established is one of important technical subjects.

With regard to thin-film transistors used to, e.g., make liquid-crystal display devices drive with matrices, even when their gate width is made finer, the value of electric current that is necessary for circuit drive can sufficiently be ensured as long as a high mobility of carriers has been achieved, so that pixels can be arranged in fine pitches. Hence, devices can be made compact and feasible for highly minute display relatively with ease. Accordingly, it is sought to provide thin-film transistors having characteristics of higher mobility.

In photovoltaic devices having a p-i-n junction, where the i-type semiconductor layer that functions substantially as a light absorption layer is formed as an i-type semiconductor layer containing a crystal phase, there is an advantage that the phenomenon of photodeterioration due to the Staebler-Wronski effect, which comes into question in the case of amorphous components, can be kept from occurring. Hence, it is effective to form any i-type semiconductor layer as the i-type semiconductor layer containing a crystal phase. Also, thin-film transistors formed of the semiconductor layer containing a crystal phase have a mobility which is greater by two figures or more, than thin-film transistors formed of an amorphous-phase semiconductor layer, and hence are expected to be greatly improved in TFT (thin-film transistor) characteristics.

With the foregoing for a background, in recent years, studies are made in variety on techniques concerning how silicon-based films be deposited at a higher rate and techniques concerning the formation of silicon-based films containing a crystal phase.

A high-frequency plasma CVD improved in film formation rate is disclosed in Japanese Patent Publication No. 7-105354. More specifically, it discloses that, where the frequency of high-frequency power is represented by f (MHz) and the distance between a substrate and an electrode by d (cm), in the range where f is 25 to 150 MHz and taking note of the relationship between f and d, it is preferable to form films setting f/d within the range of 30 to 100 MHz and that a method is particularly preferred in which films are formed in the region where d is 1 to 3 cm or the region where pressure is 0.1 to 0.5 mbar.

With regard to processes of forming crystalline silicon-based films, Japanese Patent Application Laid-Open No. 11-330520 discloses that a silicon-based thin-film layer can be formed at a high rate when formed under conditions that silane-based gas and hydrogen gas are used, the internal pressure of a reaction chamber is set at 5 Torr or more and the substrate-electrode distance is 1 cm or less.

As a method of forming a high-quality deposited film, Japanese Patent Application Laid-Open No. 6-97078 also discloses a method in which a voltage making the substrate surface have negative potential is applied to the substrate-side electrode.

In processes for forming silicon-based films on substrates by plasma CVD, it has become known that the film formation rate can be made higher by making higher the high-frequency power to be supplied, making smaller the distance between the substrate and a high-frequency power feed section, and making higher the high-frequency power per plasma space.

However, an increase in the high-frequency power per plasma space results in an increase in electron density in the plasma and concurrently therewith an increase in ion density. Also, positive ions are accelerated by electrostatic attraction in the sheath region in a discharge space. Hence, ion bombardment may take place to strain atomic arrangement in the bulk or cause formation of voids in the film. Thus, making higher the high-frequency power per plasma space can be an inhibitory factor against the formation of high-quality silicon-based films.

In the method disclosed in Japanese Patent Application Laid-Open No. 6-97078, it is also considered difficult to keep the positive ions from ion bombardment, and also it is considered difficult to apply the method to a roll-to-roll method which is a method of forming large-are silicon-based films continuously.

SUMMARY OF THE INVENTION

An object of the present invention is to provide a silicon-based film formation process which can form a silicon-based film having less defect density and superior characteristics, at a lower cost and a higher film formation rate than any conventional processes.

Another object of the present invention is to provide a silicon-based film having less defect density.

Still another object of the present invention is to provide a semiconductor device having good electrical characteristics, also having superior adherence to any underlying layer, environmental resistance and so forth, and can enjoy a short tact time at the time of manufacture.

The silicon-based film formation process of the present invention is a process comprising feeding a source gas into a vacuum reactor, and applying a high-frequency power to a high-frequency power feed section installed in the vacuum reactor, to cause plasma to take place to form a silicon-based film by chemical vapor deposition on a substrate placed on an electrode provided at a position opposing the high-frequency power feed section and grounded electrically, and is characterized in that;

the film is formed superimposing a direct-current potential on the high-frequency power to set the potential of the high-frequency power feed section to a potential which is lower by V1 than the ground potential, the V1 satisfying the following expression:

$$|V2| \leq |V1| \leq 50 \times |V2|,$$

where V2 is the potential difference from the ground potential, produced in the electrode in the state the plasma has taken place under the same conditions except that the direct-current potential is not superposed on the high-frequency power and the electrode is brought into a non-grounded state.

The silicon-based film of the present invention is characterized by being formed by the above silicon-based film formation process.

The semiconductor device of the present invention is a semiconductor device having on a substrate a semiconductor junction formed of silicon-based films, and is characterized in that at least one silicon-based film in the semiconductor device is the above silicon-based film.

The silicon-based film formation system of the present invention comprises:

a vacuum reactor;

a gas feed pipe for feeding a source gas into the vacuum reactor;

a high-frequency power feed section installed in the vacuum reactor;

a high-frequency power source for applying a high-frequency power to the high-frequency power feed section;

an electrode provided at a position opposing the high-frequency power feed section; and a direct-current power source for superposing a direct-current potential on the high-frequency power applied to the high-frequency power feed section; and is characterized in that the electrode is electrically grounded, and the potential of the high-frequency power feed section is so set as to be a potential which is lower by V1 than the ground potential; the V1 satisfying the following expression:

$$|V2| \leq |V1| \leq 50 \times |V2|,$$

where V2 is the potential difference from the ground potential, produced in the electrode in the state the plasma has taken place under the same conditions except that the direct-current potential is not superposed on the high-frequency power and the electrode is brought into a non-grounded state.

The direct-current potential V1 may preferably be within the range of $2 \times |V2| \leq |V1| \leq 30 \times |V2|$. In the high-frequency plasma CVD, the substrate may preferably be so set as to serve also as the electrode provided at a position opposing the high-frequency power feed section and grounded electrically. The high-frequency power may preferably have a frequency of from 20 MHz to 500 MHz. The high-frequency power may more preferably have a frequency of from 30 MHz to 150 MHz. The silicon-based film may preferably be a silicon-based film containing a crystal phase. The silicon-based film containing a crystal phase may preferably contain a region in which the diffraction intensity of the (220)-plane, measured by X-ray or electron-ray diffraction of the crystal phase, is in a proportion of 80% or more with respect to the total diffraction intensity.

The source gas may preferably contain at least one of silicon hydride and silicon fluoride, and hydrogen. The distance between the high-frequency power feed section and the substrate may preferably be from 3 mm to 30 mm. The silicon-based film may preferably be formed under a pressure of from 100 Pa (0.75 Torr) to 5,000 Pa (37.5 Torr). In forming the silicon-based film, the source gas may preferably be fed at a residence time of from 0.01 second to 10 seconds. In forming the silicon-based film, the source gas may more preferably be fed at a residence time of from 0.1 second to 3 seconds. In forming the silicon-based film, the high-frequency power may preferably be applied at a density of from 0.01 W/cm$^3$ to 2 W/cm$^3$. In forming the silicon-based film, the high-frequency power may more preferably be applied at a density of from 0.1 W/cm$^3$ to 1 W/cm$^3$.

The silicon-based film may preferably contain at least one of oxygen atoms, carbon atoms and nitrogen atoms, which may be in a total content of from $1.5 \times 10^{18}$ atoms/cm$^3$ to $5.0 \times 10^{19}$ atoms/cm$^3$. The silicon-based film may preferably contain fluorine atoms in a content of from $1.0 \times 10^{19}$ atoms/cm$^3$ to $2.5 \times 10^{20}$ atoms/cm$^3$.

The semiconductor device having a semiconductor junction may preferably be a photovoltaic device having at least one set of a p-i-n semiconductor junction in which a semiconductor layer showing a first conductivity type, an i-type semiconductor layer and a semiconductor layer showing a second conductivity type are superposed in order.

DESCRIPTION OF THE PREFERRED EMBODIMENTS

Figure 1:
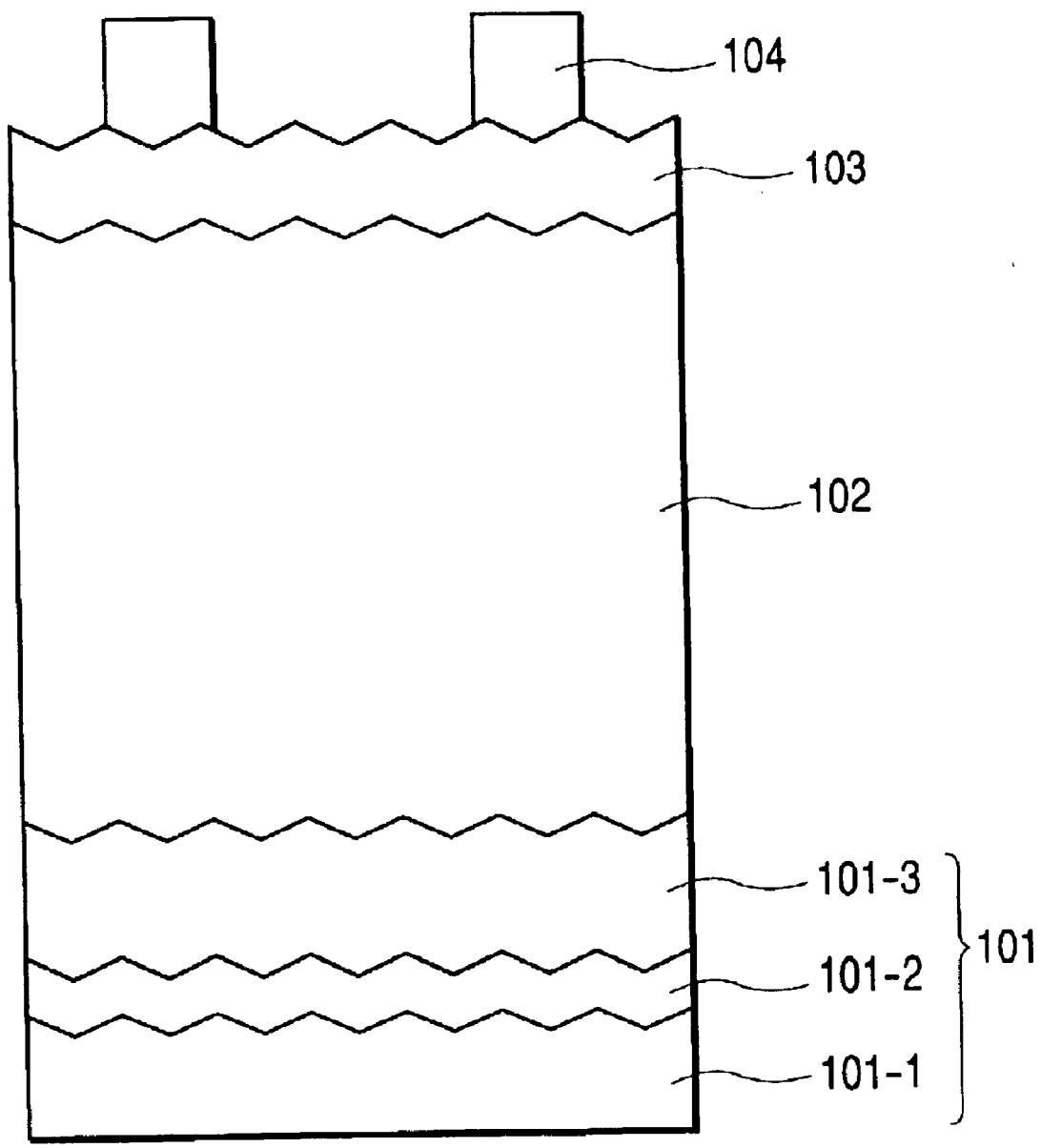
FIG. 1 is a diagrammatic sectional view showing an example of a photovoltaic device having the semiconductor device of the present invention.

As a result of extensive studies repeatedly made in order to solve the problems discussed above, the present inventors have discovered that the film may be formed superimposing a direct-current potential on the high-frequency power to set the potential of the high-frequency power feed section to a potential which is lower by V1 than the ground potential; the V1 satisfying $|V2| \leq |V1| \leq 50 \times |V2|$, whereby a silicon-based film having less defect density can be formed and, in a semiconductor device at least one silicon-based film of which has been formed in this way, a semiconductor device having good electrical characteristics and having superior adherence (to an underlying layer) and environmental resistance can be formed at a low cost.

As a means for forming the silicon-based film of the present invention, plasma CVD making use of high-frequency power is a superior process. The process of forming the silicon-based film by such plasma CVD making use of high-frequency power is advantageous for cost reduction because it may require a shorter processing time and a lower processing temperature than formation processes effected by solid-phase reaction. In particular, where the present invention is applied to the formation of semiconductor layers having a large layer thickness as in the case of the i-type semiconductor layer having a semiconductor junction, this effect can greatly be brought out. In particular, it is a preferable advantage that the i-type semiconductor layer can be formed at film formation rate of 2.0 nm/second or more.

In the process comprising feeding a source gas into a vacuum reactor to form a silicon-based film by high-frequency plasma CVD on a substrate introduced into the vacuum reactor, it is considered that the film formation rate can be made higher by making smaller the distance between the high-frequency power feed section and the substrate or making higher the high-frequency power to be supplied, because the plasma density per volume of the discharge space can be made higher and the reaction species contributory to the formation of deposited films can be formed in a high density. Here, from the viewpoints that source gases can be decomposed in a good efficiency and the high-frequency power can uniformly be fed into the plasma space from a large-area high-frequency power feed section, the high-frequency power may preferably have a frequency in the range of from 20 MHz to 500 MHz, and more preferably from 30 MHz to 150 MHz.

On the other hand, in the case when the distance between the high-frequency power feed section and the substrate is made smaller, it is considered that the electron density in plasma increases and, concurrently therewith, positive ions are generated in a larger quantity. The positive ions are accelerated by electrostatic attraction in the sheath region in the discharge space. Hence, ion bombardment may take place to strain atomic arrangement in the bulk or cause formation of voids in the film. Thus, it is considered that this can be an inhibitory factor against the formation of high-quality silicon-based films.

Accordingly, the direct-current potential is superimposed on the high-frequency power to set the potential of the high-frequency power feed section to a low potential. This enables the positive ions generated in plasma, to be actively attracted to the high-frequency power feed section side in a fairly large quantity. Hence, the ions can be kept from bombarding the substrate, and the high-quality silicon-based film can be formed. Also, any coarse film can be kept from being formed, and a dense film can be formed in a high uniformity. Hence, the silicon-based film having good adherence to an underlying layer and superior environmental resistance can be formed. This effect is considered to be more effectively brought out where the potential of the high-frequency power feed section is set to a potential lower than the potential of the substrate.

Making the internal pressure of the film formation space higher makes the ions in plasma collide against other ions and active species on more occasions. Hence, it is also considered that the force of bombardment of ions can be lowered and the quantity itself of ions can be made small. Thus, the bombardment of ions can be expected to be relatively lowered.

However, when high-frequency power with a high density is applied under a high pressure, the reaction of collision between decomposed products and source gases is accelerated, so that fine powder tends to be produced in the plasma space. Any fine powder standing charged electrically tends to stay in the plasma, so that further growth may proceed. It is considered that the fine powder thus produced is incorporated into the film in the course of the reaction to lower film characteristics. Moreover, any accumulation of such fine powder in the system may lower operating efficiency, and can be a cause of making device cost higher. Especially in the above frequency range, it is hard for the charged fine powder to be followed up, and hence it is difficult to remove it from the plasma space, as so considered.

Accordingly, the direct-current potential is superimposed on the high-frequency power to set the potential of the high-frequency power feed section to a low potential. It is considered that this enables removal of the charged fine powder from the plasma space by electrostatic attraction at the stage it stands as fine clusters. However, any too large potential difference can be a cause of breakdown which may occur when abnormal discharge such as sparks occurs between electrodes or when the deposited-film surface undergoes charge-up.

Taking the foregoing into consideration, in order to brought out the effect of the present invention effectively, a direct-current potential is superimposed on the high-frequency power to set the potential of the high-frequency power feed section to a potential which is lower by V1 than the ground potential, and the V1 is set within the range of $|V2| \leq |V1| \leq 50 \times |V2|$, where V2 is the potential difference from the ground potential, produced in the electrode in the state the plasma has taken place under the same conditions except that the direct-current potential is not superposed on the high-frequency power and the electrode is brought into a non-grounded state. The V1 may preferably be within the range of $2 \times |V2| \leq |V1| \leq 30 \times |V2|$.

Here, as the high-frequency plasma CVD, it is preferable to use a roll-to-roll method. In the roll-to-roll method, a plurality of semiconductor-forming vacuum reactors are provided. A sufficiently long beltlike substrate having a desired width passes on through the plurality of semiconductor-forming vacuum reactors. More specifically, the substrate is continuously transported in its lengthwise direction so that the necessary semiconductor films are respectively formed in the plurality of semiconductor-forming vacuum reactors. Thus, in the roll-to-roll method, a large-area device having the desired semiconductor junction can continuously be formed.

In the roll-to-roll method, deposited films are formed maintaining plasma in the plurality of semiconductor-forming vacuum reactors. Hence, it is difficult to maintain the potential of the substrate to a different potential for each of the plurality of semiconductor-forming vacuum reactors. Accordingly, in the roll-to-roll method, the method is preferred in which, setting the substrate side to the ground potential, the direct-current potential is superimposed on the high-frequency power applied to the high-frequency power feed section to control the plasma potential.

Where the substrate is a conductive substrate, the substrate may be so set as to serve also as the electrode provided at a position opposing the high-frequency power feed section and grounded electrically.

The silicon-based film of the present invention may be a film comprising an amorphous layer, or may be a film comprising a crystal phase, or may be a film having a mixed structure of an amorphous layer and a crystal phase. The mixed structure of an amorphous layer and a crystal phase may be a structure in which the crystal phase stands dispersed in the amorphous layer, or may be a structure in which the crystal phase has agglomerated. Still also, it may be a structure having in the amorphous phase a region where regions having structural order of diamond structure are dispersedly present.

The crystal-phase silicon has characteristics such that it has a lower defect density of Si—Si bonds than the amorphous-phase silicon and has a greater carrier mobility and a longer recombination lifetime than any amorphous-phase silicon standing non-equilibrium thermodynamically. It also has superior stability in characteristics over a long time and also has a strong point that its characteristics may hardly change even in an environment of high temperature and high humidity. Hence, in the semiconductor device having a semiconductor junction formed of a silicon-based film, there is a possibility that a semiconductor device having much superior characteristics and also superior stability can be formed using in, e.g., photovoltaic devices or TFTs the silicon-based film containing a crystal phase.

In the mean time, as a problem caused when the silicon-based layer containing a crystal phase is employed in the i-type semiconductor layer, it is considered that crystal grain boundaries affect both majority carriers and minority carriers to deteriorate performances. In order to keep the crystal grain boundaries from affecting the carriers, it is considered to be an effective means to enlarge crystal grain size in the i-type semiconductor layer to lower its crystal grain boundary density.

As a means for enlarging the crystal grain size, it is preferable to keep crystal nuclei from forming and make the orientation property of crystals higher. Where the formation of a film proceeds in a random crystal direction, it is considered that individual crystal grains collide against one another in the course of growth and the size of crystal grains becomes small or internal stress is produced. Such random mutual collision of crystals can be kept from occurring by orienting the crystals in a specific direction and further controlling the formation of crystal nuclei to uniform the directionality of growth. This can keep the crystal grains from colliding at random against one another, so that the crystal grain size can be made larger, the internal stress can be kept from being produced, and the high-quality silicon-based film can be formed, as so considered.

Incidentally, where any internal stress has been produced in the silicon-based film, its band profile may undergo strain, or a region may appear in which an electric field lowers at the time of light irradiation in the carrier-generating layer. In TFTs, the leakage current flowing when the switch is put off may increase. Such problems may occur.

In crystalline silicon having a diamond structure, (220)-plane has the highest in-plane atom density, and the silicon atom in the growth surfacemost plane has a structure wherein three arms among the four bonding arms are joined to other silicon atoms by covalent bonding. Hence, it is considered that, where this plane is used as the growth plane, the silicon-based layer having good adherence in fine crystals and between fine crystals one another and good weatherability can be formed.

Where a TFT of a reverse stagger type is used as a device of an active-matrix type liquid-crystal display device, the region coming into contact with an ohmic contact layer of active layers may be formed as a silicon-based film containing microcrystals oriented predominantly to (220)-plane. This makes it possible to remove the ohmic contact layer completely without etching the active layers when the ohmic contact layer is dry-etched in the course of the formation of the film, which layer can be removed without use of any etching stopper materials such as nitride film. This is attributable to the fact that the (220)-plane has a rich etching resistance.

From an ASTM card, in non-oriented crystalline silicon the proportion of diffraction intensity of (220)-plane with respect to the total sum of diffraction intensities corresponding to eleven reflections from the low-angle side is about 23%. It follows that any structure in which the proportion of diffraction intensity of (220)-plane is larger than 23% has the orientation property in this plane direction. In particular, a structure containing a region in which the proportion of diffraction intensity of (220)-plane is 80% or more can more bring out the above effect, and is particularly preferred.

Where a system containing a silicon hydride compound (e.g., $SiH_4$) is used as a source gas and when the distance between the high-frequency power feed section and the substrate is made smaller as stated previously, the hydrogen decomposition of $SiH_4$ is accelerated because of an increase in the high-frequency power absorbed per unit discharge space volume. Here, the silicon-based film is considered to be formed through the course of i) the movement of reaction species from the gaseous phase to the substrate surface and ii) the diffusion and deposition thereof on the substrate surface. In order that the surface diffusion may sufficiently take place and the course of effecting the chemical bonding at safe sites is sufficiently taken, it is considered desirable that an $SiH_3$ radical comes to the reaction species, taking account of, e.g., the lifetime of radicals. Also, where various radicals such as SiH and $SiH_2$ have come to reaction species, it is considered that the form of reaction on the surface may come complicate and, concurrently therewith the defect density increases. Accordingly, it is desirable that the $SiH_3$ radical functions as the reaction species.

Here, as a factor of an increase in density of the radicals such as SiH and $SiH_2$, it is considered that an increase in electron density in the plasma causes exhaustion of $SiH_4$ gas in the atmosphere of plasma to lessen the secondary reaction of radicals such as SiH and $SiH_2$ with $SiH_4$, resulting in a decrease in the rate of exhaustion of the radicals such as SiH and $SiH_2$. In order not to increase the density of radicals such as SiH 'and $SiH_2$ in the atmosphere in which the electron density in the plasma has increased, it is considered that this can be done by so feeding gases that the density of $SiH_4$ in the atmosphere of plasma is kept from lowering, to control the plasma.

In high-frequency plasma CVD in which a source gas containing silicon fluoride and hydrogen is used as the source gas, it is considered that active species such as $SiF_nH_m$ ($0 \leq n$, $m \leq 4$), HF, F and H are produced. The atmosphere of plasma which contains these active species is characterized in that there are active species contributory to etching, in addition to the active species contributory to the deposition of silicon-based films. Hence, the deposition of film proceeds while etching Si—Si bonds having relatively weak bonding force at the surface, and this makes it possible to form a silicon-based film having less amorphous regions and having a high crystallinity.

In the course of etching, radicals are also formed as the bonds are cut off, and the structural relaxation is accelerated, and this makes it possible to form a good silicon-based film at a processing temperature which is a lower temperature. In such a system, hydrogen-containing fluorinated silane type active species such as $SiF_2H$ and $SiFH_2$ are also formed, which are formed by adding hydrogen to silicon fluoride, and this makes it possible to form films at a high rate.

In order to form the above hydrogen-containing fluorinated silane type active species such as $SiF_2H$ and $SiFH_2$, it is important to decompose the silicon fluoride in a good efficiency to form SiF and what is also important is the course of active reaction attributable to the SiF formed and the activated hydrogen, as so considered. It is considered that what is particularly important is that the SiF is sufficiently present in the plasma. In order to materialize the formation of silicon-based films having the orientation property, at a high-rate film formation as a total while also performing the etching, it is an important technical subject to control the plasma processing. Accordingly, in order to perform the course of active reaction attributable to the SiF and the activated hydrogen, it is important as stated above to make higher the plasma density per unit discharge space volume. In order to form the activated hydrogen in a larger quantity in the atmosphere having increased in electron density in the plasma, it is preferable to feed as the source gas a silicon fluoride gas which contains hydrogen gas so as to keep $H_2$ gas from being exhausted.

In addition, where the density of radicals such as SiH and $SiH_2$ has increased in the plasma, crystallization on these serving as nuclei tends to occur in the discharge space and on the deposited-film surface. Hence, this may cause formation of a reaction by-product such as polysilane or may act as an inhibitory factor against enlargement of crystal-grain diameter. Accordingly, it is necessary to control the density of radicals such as SiH and $SiH_2$, too. In order to achieve these, it is effective to feed additional source gases actively while allowing the decomposition of source gases to proceed, to make the secondary reaction take place actively which accelerates the disappearance of the radicals such as SiH and $SiH_2$.

In view of the form of reaction as described above, i.e., the form of reaction that does not cause any exhaustion of $SiH_4$, $H_2$ and SiF, the residence time $\tau$ (second) defined as $\tau=592 \times V \times P/Q$, where, as parameters of plasma, V is the volume ($m^3$) of the discharge space in which the plasma is taking place, Q is the flow rate ($cm^3$/min.(normal)) of the source gas and P is the internal pressure (Pa) of the discharge space, should be noted as parameters for controlling the plasma. This enables formation of plasma having the desired plasma atmosphere. In order to obtain high-quality silicon-based films, it is important to control the residence time in addition to the parameters described above, such as the distance between the high-frequency power feed section and the substrate and the internal pressure.

Taking account of the foregoing, the present inventors have repeatedly made extensive studies. As the result, they have discovered that, in order to form silicon-based films having less defect density and superior characteristics, the distance between the high-frequency power feed section and the substrate may preferably be set to be from 3 mm to 30 mm. It may more preferably be from 6 mm to 25 mm, and still more preferably from 9 mm to 20 mm.

The internal pressure of the discharge space may be set to be from 100 Pa (0.75 Torr) to 5,000 Pa (37.5 Torr). This is preferable in order to form silicon-based films having less defect density and superior characteristics, at a much higher rate. It may more preferably be from 100 Pa to 3,000 Pa.

It is further preferable to set the residence time $\tau$ within the range of from 0.01 second to 10 seconds. Setting it within this range makes it possible to control the radical density in plasma and to form silicon-based films having much less defect density and superior characteristics, at a much higher rate.

A method of forming films by CVD making use of high-frequency power with a frequency of from 10 MHz to 10 GHz is preferred as described previously. In order to further control electron temperature in plasma and also make it easy to form large-area and uniform plasma, particularly preferred is a method of forming films by CVD making use of high-frequency power with a frequency of from 20 MHz to 300 MHz. Also, the high-frequency power may preferably be applied at a density within the range of from 0.01 W/cm$^3$ to 2 W/cm$^3$ per discharge space where the plasma is taking place.

In view of the influence on or adherence to an underlying layer, the environmental resistance and the effect of lowering photodeterioration rate, the film residence time may be from 0.1 second to 3 seconds and the high-frequency power density per discharge space where the plasma is taking place may be from 0.1 W/cm$^3$ to 1 W/cm$^3$, as more preferred ranges.

Controlling these within the above ranges when devices such as photovoltaic devices are formed can also keep the components, film quality, characteristics and so forth of an underlying layer from undergoing changes due to the action of reduction caused by hydrogen in the plasma atmosphere, to eliminate any bad influence thereof on the underlying layer. Where a transparent conductive film formed of a metal oxide such as zinc oxide is used as the underlying layer, the above controlling is especially effective because the transmittance of the transparent conductive film can be prevented from decreasing because of the reduction and the characteristics of the photovoltaic devices can be prevented from lowering concurrently therewith.

As a further additional function, the adherence between the silicon-based film and any underlying layer can be improved. Supposedly, this effect is brought out because of any active surface diffusion of $SiH_3$, $SiF_2H$ or $SiFH_2$ radicals, which always relaxes the strain due to stress in the vicinity of the surface and, in the course of such relaxation, the deposited films are formed.

Hydrogen partial pressure can also be made relatively higher. Hence, in the case of the silicon-based film containing a crystal phase, the effect of passivation of crystal grain boundaries can be made higher to promote inactivation of the crystal grain boundaries, so that the hydrogen atoms having been incorporated into a silicon network can be kept from coming liberated abruptly. This enables prevention of any plastic flow due to occurrence of irregular regions in the silicon network, and prevention of cracks or agglomeration which may occur concurrently therewith. Hence, silicon-based films having superior film quality and adherence can be formed, and a photovoltaic device having superior environmental resistance can be provided when constructed to have such silicon-based films.

The silicon-based film described above may also contain at least one of oxygen atoms, carbon atoms and nitrogen atoms. This is preferable because such atoms, when arranged at crystal grain boundaries or in void-like spaces in amorphous structure, can improve structural stability. Also, in the case of the silicon-based film containing a crystal phase, its crystal grain boundaries can have a high electrical resistance, and hence any leakage current can be kept from occurring. The incorporation of such atoms is also preferable because, though the reason is unclear in detail, any new crystal nuclei can be kept from being produced on the growth plane, bringing about the effect of improving the uniformity of cross-sectional size of fine crystals. These effects can effectively be brought out when the oxygen atoms, carbon atoms and/or nitrogen atoms are in a total content of $1.5 \times 10^{18}$ atoms/cm$^3$ or more. Here, if the oxygen atoms, carbon atoms and/or nitrogen atoms are in a too large total content, they may be taken into the bulk of fine crystals to lower crystallizability of the film. Accordingly, as a preferable range, the oxygen atoms, carbon atoms and/or nitrogen atoms may preferably be in a total content of $5.0 \times 10^{19}$ atoms/cm$^3$ or less.

The silicon-based film may also contain fluorine atoms. Its incorporation with fluorine atoms is preferable because the grain boundaries of fine crystals and any structurally mismatched regions of amorphous structure can be passivated in a good efficiency, and also because fluorine atoms, which have a great electronegativity, can inactivate the silicon atoms' dangling bonds standing revealed at grain boundaries of fine crystals. Such fluorine atoms may be in a content of from $1.0 \times 10^{19}$ atoms/cm$^3$ to $2.5 \times 10^{20}$ atoms/cm$^3$.

Taking the case of a photovoltaic device as the semiconductor device of the present invention, component factors of the device are described below.

FIG. 1 is a schematic sectional view showing an example of the photovoltaic device of the present invention. In FIG. 1, reference numeral 101 denotes a substrate; 102, a semiconductor layer; 103, a second transparent conductive layer; and 104, a collector electrode. Also, reference numeral 101-1 denotes a base member; 101-2, a metal layer; and 101-3, a first transparent conductive layer. These constitute the substrate 101.

(Base Member)

As the base member 101-1, a plate-like member or sheet-like member comprised of metal, resin, glass, ceramic or semiconductor bulk may preferably be used. Its surface may have fine unevenness. A transparent base member may also be used so that the light can enter on the base member side. Also, the base member may have the form of a continuous sheet so that films can continuously be formed by the roll-to-roll method. In particular, a material having a flexibility, such as stainless steel or polyimide, is preferable as the materials for the base member 101-1.

(Metal Layer)

The metal layer 101-2 has function as an electrode and function as a reflective layer from which the light having reached the base member 101-1 reflects so as to be again utilized in the semiconductor layer 102. As materials therefor, Al, Cu, Ag, Au, CuMg, AlSi and so forth may preferably be used. As processes for its formation, processes such as vacuum deposition, sputtering, electrodeposition and printing may preferably be used. The metal layer 101-2 may preferably have unevenness at its surface. This can make the reflected light have a larger optical-path length in the semiconductor layer 102 to make short-circuit current larger. Where the base member 101-1 has a conductivity, the metal layer 101-2 need not be formed.

(First Transparent Conductive Layer)

The first transparent conductive layer 101-3 has the function to make the reflected light have a larger optical-path length in the semiconductor layer 102. It also has the function to cause the element of the metal layer 101-2 to diffuse or migrate to the semiconductor layer 102 to prevent the photovoltaic device from shunting. Where it has an appropriate resistance, it still also has the function to prevent the photovoltaic device from causing a short circuit due to any defects such as pinholes of the semiconductor layer. In addition, the first transparent conductive layer 101-3 may preferably have, like the metal layer 101-2, unevenness at its surface. The first transparent conductive layer 101-3 may preferably be formed of a conductive oxide such as ZnO or ITO (indium-tin oxide), and may preferably be formed by a process such as vacuum deposition, sputtering, CVD or electrodeposition. A substance which changes conductivity may also be added to such a conductive oxide.

Where a zinc oxide film is used as the first transparent conductive layer, as its formation process it may preferably be formed by a process such as sputtering or electrodeposition, or using these processes in combination.

Conditions for forming the zinc oxide film by sputtering are greatly influenced by processes, types and flow rates of gases, internal pressure, electric power to be applied, film formation rate, substrate temperature and so forth. For example, where the zinc oxide film is formed by DC magnetron sputtering and using a zinc oxide target, the types of gases may include Ar, Ne, Kr, Xe, Hg and O$_2$. The flow rates may differ depending on the size of apparatus and on evacuation rate, and may preferably be from 1 sccm to 10 sccm when, e.g., the film formation space has a volume of 20 liters. Also, the internal pressure at the time of film formation may preferably be from $1 \times 10^{-4}$ Torr to 0.1 Torr. The electric power to be applied, which depends on the size of the target, may preferably be from 10 W to 100 kW when the target has a diameter of 15 cm. Also, the substrate temperature may differ in preferable ranges, depending on the film formation rate, and may preferably be from 70° C. to 450° C. when films are formed at a rate of 1 μm/h.

As to conditions for forming the zinc oxide film by electrodeposition, an aqueous solution containing nitrate ions and zinc ions may preferably be used in a corrosion-resistant vessel. The nitrate ions and zinc ions may preferably be in a concentration ranging from 0.001 mol/l to 1.0 mol/l, more preferably ranging from 0.01 mol/l to 0.5 mol/l, and more preferably ranging from 0.1 mol/l to 0.25 mol/l. Feed sources of the 'nitrate ions and zinc ions may be, but not particularly limited to, zinc nitrate, which is a feed source for the both ions, or a mixture of a water soluble nitrate such as ammonium nitrate, which is a feed source for the nitrate ions, and a zinc salt such as zinc sulfate, which is a feed source for the zinc ions.

In order to control any abnormal growth or improve adherence, it is also preferable to further add a carbohydrate to any of these aqueous solution. There are no particular limitations on the type of the carbohydrate, and usable are monosaccharides such as glucose (grape sugar) and fructose (fruit sugar), disaccharides such as maltose (malt sugar) and sucrose (cane sugar), polysaccharides such as dextrin and starch, and mixture of any of these. The carbohydrate in the aqueous solution may preferably be in an amount ranging from 0.001 g/l to 300 g/l, more preferably ranging from 0.005 g/l to 100 g/l, and still more preferably ranging from 0.01 g/l to 60 g/l, which depends on the type of the carbohydrate.

In the case when the zinc oxide film is formed by electrodeposition, in the above aqueous solution, the base member on which the zinc oxide film is to be deposited is set as the cathode, and zinc, platinum, carbon or the like as the anode. Here, electric current which flows through a load resistor may preferably be at a density of from 10 mA/dm$^2$ to 10 A/dm$^2$.

(Substrate)

By the process described above, the metal layer 101-2 and the first transparent conductive layer 101-3 are superposed on the base member 101-1 to form the substrate 101. In order to make the integration of the device easy, an insulating layer may also be provided as an intermediate layer in the substrate 101.

(Semiconductor Layer)

As a chief material for the semiconductor layer 102 the silicon-based layer of the present invention constitutes as part thereof, silicon (Si) is used. In addition to silicon, an alloy of silicon with carbon (C) or with germanium (Ge) may be used. To form the semiconductor layer as a p-type semiconductor layer, a Group III element is incorporated, and to form it as an n-type semiconductor layer a Group V element. As electrical properties of the p-type layer and n-type layer, they may preferably be those having an activation energy of 0.2 eV or below, and most preferably 0.1 eV or below. As specific resistance, it may preferably be 100Ω·cm or below, and most preferably 1Ω·cm or below. In the case of a stacked cell (a photovoltaic device having a plurality of p-i-n junctions), the i-type semiconductor layer in a p-i-n junction close to the light-incident side may preferably have a broad band gap and have a band gap which is narrower in a farther p-i-n junction. It is suitable for a doped layer (p-type layer or n-type layer) on the light-incident side to be formed of a crystalline semiconductor less absorptive of light or a semiconductor having a broad band gap.

Figure 3:
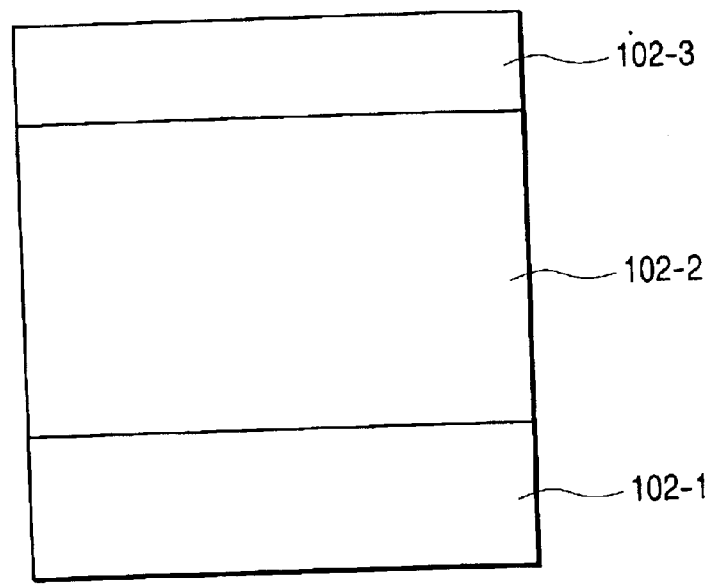
FIG. 3 is a diagrammatic sectional view showing an example of a semiconductor layer constituting the semiconductor device of the present invention.

The semiconductor layer 102, a component factor of the present invention, is further additionally described. FIG. 3 is a schematic sectional view showing as an example of the photovoltaic device of the present invention a semiconductor layer 102 (102-1, 102-2, 102-3) having a set of p-i-n junction. In FIG. 1, reference numeral 102-1 denotes a semiconductor layer showing a first conductivity type, on which an i-type semiconductor layer 102-2 comprising the silicon-based film of the present invention and a semiconductor layer 102-3 showing a second conductivity type are further superposed thereon. In the semiconductor layer having a plurality of p-i-n junctions, at least one of them may preferably have the above construction.

As an example of a stacked cell in which two p-i-n junctions have been superposed, it may include, as combination of i-type semiconductor layers, a cell having (amorphous-silicon semiconductor layer/semiconductor layer containing fine crystals) or (semiconductor layer containing fine crystals/semiconductor layer containing fine crystals) from the light-incident side.

As an example of a stacked cell in which three p-i-n junctions have been superposed, it may include, as combination of i-type semiconductor layers, a cell having (amorphous-silicon semiconductor layer/semiconductor layer containing fine crystals/semiconductor layer containing fine crystals) or (amorphous-silicon semiconductor layer/semiconductor layer containing fine crystals/amorphous-silicon-germanium semiconductor layer) from the light-incident side.

The i-type semiconductor layer may preferably have an absorptivity coefficient ($\alpha$) of light (630 nm) of 5,000 cm$^{-1}$ or more, a light conductivity ($\sigma p$) of $10 \times 10^{-5}$ S/cm or more and a dark conductivity ($\sigma d$) of $10 \times 10^{-6}$ S/cm or less under irradiation by solar simulator light using a solar simulator (AM 1.5, 100 mW/cm$^2$), and an Urbach energy of 5 meV or below according to the constant photocurrent method (CPM). As the i-type semiconductor layer, a layer slightly made into p-type or n-type may also be used. Also, where a silicon-germanium semiconductor layer is formed as the i-type semiconductor layer, the device may be so constructed that an i-type semiconductor layer containing no germanium is inserted to at least one of p/i interface and n/i interface for the purposes of reducing interface states and enhancing open-circuit voltage.

(Process of Forming Semiconductor Layer)

To form the silicon-based film of the present invention and the semiconductor layer 102, the high-frequency plasma CVD is suited. A preferred example of the procedure to form the semiconductor layer 102 by the high-frequency plasma CVD is shown below.

(1) The inside of a semiconductor-forming vacuum reactor which can be brought into a vacuum is evacuated to a stated deposition pressure.

(2) Processing gases such as the source gas and a dilute gas are introduced into a deposition chamber, and the inside of the deposition chamber is evacuated by means of a vacuum pump, in the course of which the inside of the deposition chamber is set to a stated deposition pressure.

(3) The substrate 101 is heated to a stated temperature by means of a heater.

(4) High-frequency power produced by a high-frequency power source is introduced into the deposition chamber. It may be introduced into the deposition chamber by a method in which, when the high-frequency power is microwave power, it is guided through a waveguide and is introduced into the deposition chamber via a dielectric window made of quartz, alumina, aluminum nitride or the like, or a method in which, when the high-frequency power is VHF or RF power, it is guided through a coaxial cable and is introduced into the deposition chamber via a metal electrode.

(5) Plasma is caused to take place in the deposition chamber to decompose the source gas to form a deposited film on the substrate 101 placed in the deposition chamber. This procedure is optionally repeated a plurality of times to form the semiconductor layer 102.

The semiconductor layer 102 may be formed under conditions of a substrate temperature of from 100° C. to 450° C., a pressure of from 0.067 Pa (0.5 mTorr) to $1.5 \times 10^4$ Pa (113 Torr) and a high-frequency power density of from 0.001 W/cm$^3$ to 2 W/cm$^3$ in the deposition chamber, which are given as preferred conditions.

When the silicon-based film of the present invention is formed, it is further preferable that the distance between the high-frequency power feed section and the substrate is set to be from 3 mm to 30 mm, the internal pressure of the discharge space is set to be from 100 Pa (0.75 Torr) to 5,000 Pa (37.5 Torr), and the residence time $\tau$ (second) defined as $\tau = 592 \times V \times P/Q$, where V is the volume (m$^3$) of the discharge space in which the plasma is taking place, Q is the flow rate (cm$^3$/min.(normal)) of the source gas and P is the internal pressure (Pa) of the discharge space, is set to be from 0.01 second to 10 seconds.

The high-frequency power density may be from 0.01 W/cm$^3$ to 2 W/cm$^3$ as preferred conditions. As to the potential of the high-frequency power feed section, it is preferable that a direct-current potential is superimposed on the high-frequency power to set that potential to a potential which is lower by V1 than the ground potential, and the V1 is set within the range of $|V2| \leq |V1| \leq 50 \times |V2|$, where V2 is the potential difference from the ground potential, produced in the substrate in the state the plasma has taken place under the same conditions except that the direct-current potential is not superimposed on the high-frequency power and the substrate is brought into a non-grounded state. The V1 may preferably be within the range of $2 \times |V2| \leq |V1| \leq 30 \times |V2|$. As a method of superimposing the direct-current potential on the high-frequency power, as in an example shown by a deposited-film-forming apparatus shown in FIG. 2, a method is preferred in which a direct-current powder source 257 is connected through a choke coil 258 onto a circuit which connects the high-frequency power feed section and the high-frequency power source.

As source gases suited for the formation of the silicon-based film of the present invention and the semiconductor layer 102, they may include silicon fluoride compounds such as $SiF_4$, $SiH_2F_2$, $SiH_3F$ and $Si2F_6$; silicon hydride compounds such as $SiH_4$ and $Si2H_6$; and, where alloy type layers are formed, gasifiable compounds containing Ge or C, such as $GeH_4$ and $CH_4$. The source gases may preferably be introduced into the deposition chamber after they have each been diluted with hydrogen gas. An inert gas such as He may further be added. As a dopant gas for making the semiconductor layer into a p-type layer, $B2H_6$, $BF_3$ or the like may be used. Also, as a dopant gas for making the semiconductor layer into an n-type layer, $PH_3$, $PF_3$ or the like may be used. Where crystal-phase thin layers and layers less absorptive of light or having a broad band gap are deposited, it is preferable that the dilute gas is used in a larger proportion with respect to the source gas and high-frequency power having a relatively high power density is introduced.

In order to form the semiconductor layer having a large area, methods for introducing the source gases into the vacuum reactor include a method in which a plurality of holes is provided in the high-frequency power feed section and the source gases are introduced therethrough in the form of a shower into the plasma space, and a method in which a gas feed pipe provided with a plurality of holes is disposed in the plasma space. These are preferable because uniform plasma can be formed.

(Second Transparent Conductive Layer)

The second transparent conductive layer 103 serves as an electrode on the light-incident side, and also its layer thickness may appropriately be controlled so that it can also have the function of a reflection preventive layer. The second transparent conductive layer 103 is required to have a high transmittance in the wavelength region of the light the semiconductor layer 102 can absorb and have a low resistivity. It may preferably have a transmittance of 80% or more, and more preferably 85% or more, at 550 nm, and a resistivity of $5 \times 10^{-3} \Omega \cdot cm$ or lower, and more preferably $1 \times 10^{-3} \Omega \cdot cm$ or lower. As materials for the second transparent conductive layer 103, ITO, ZnO and $In_2O_3$ may preferably be used. As processes for its formation, processes such as vacuum deposition, CVD, spraying, spinning-on and dipping are preferred. A substance which changes conductivity may also be added to the above materials.

(Collector Electrode)

The collector electrode 104 is provided on the second transparent conductive layer 103 in order to improve electricity collection efficiency. It may be formed by a method in which a metal having an electrode pattern is formed by sputtering using a mask, a method in which a conductive paste or solder paste is printed, or a method in which a metal wire is fixed with a conductive paste; any of which is preferred.

A protective layer may also optionally be formed on each side of the photovoltaic device. At the same time, a reinforcing material such as a steel sheet may be used in combination, on the back (the side opposite to the light-incident side) of the photovoltaic device.

In the following examples, the present invention is described in greater detail taking the case of a solar cell and a TFT as photovoltaic devices. These examples by no means limit the subject matter of the present invention. Also, microcrystalline semiconductor layers described in the following Examples should be construed to include not only those constructed to have only crystal phases but also those constructed to contain amorphous layers partly.

EXAMPLE 1

Figure 4:
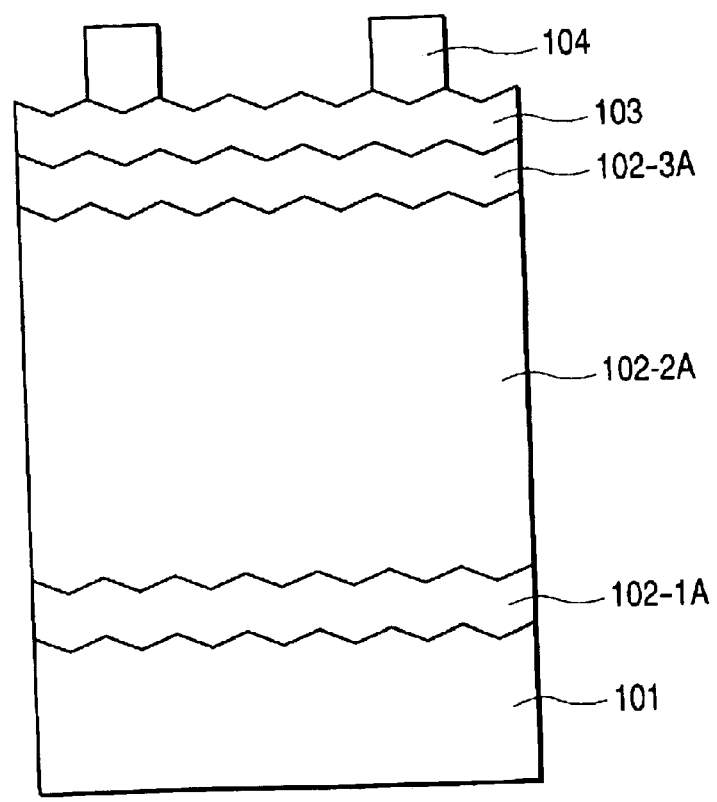
FIG. 4 is a diagrammatic sectional view showing another example of a photovoltaic device having the semiconductor device of the present invention.

Using a deposited-film-forming apparatus 201 shown in FIG. 2, a photovoltaic device shown in FIG. 4 was formed in the following way. FIG. 4 is a diagrammatic sectional view showing an example of a photovoltaic device having the silicon-based film of the present invention. In FIG. 4, the same members as those shown in FIG. 1 are denoted by the like reference numerals to avoid repeating the description. The semiconductor layer of this photovoltaic device consists of an amorphous n-type semiconductor layer 102-1A, a microcrystalline i-type semiconductor layer 102-2A and a microcrystalline p-type semiconductor layer 102-3A. Namely, this photovoltaic device is what is called a p-i-n type single-cell photovoltaic device.

Figure 2:
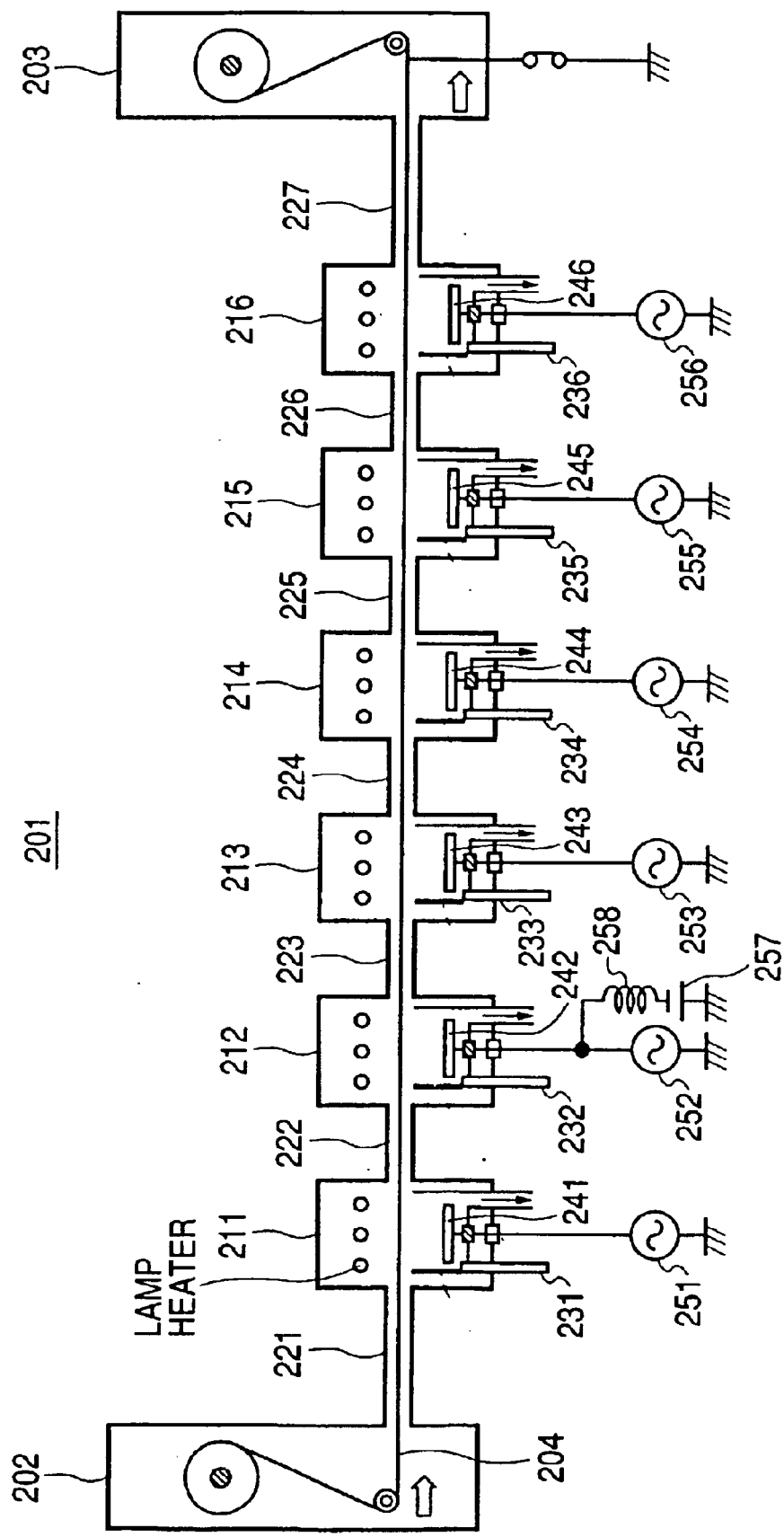
FIG. 2 is a diagrammatic sectional view showing an example of a deposited-film formation system for manufacturing the semiconductor device of the present invention and a photovoltaic device.

FIG. 2 is a diagrammatic sectional view showing an example of a deposited-film-forming apparatus for producing the silicon-based film and photovoltaic device of the present invention. The deposited-film-forming apparatus 201 shown in FIG. 2 is constituted of a substrate wind-off container 202, semiconductor-forming vacuum reactors 211 to 216 and a substrate wind-up container 203, which are joined via gas gates 221 to 227. In this deposited-film-forming apparatus 201, a belt-like conductive substrate 204 is so set as to extend through each reactor and each gas gate. The beltlike conductive substrate 204 is wound off from a bobbin provided in the substrate wind-off container 202, and is wound up on another bobbin in the substrate wind-up container 203.

The semiconductor-forming vacuum reactors 211 to 216 each have a deposition chamber. The deposition chamber is so constructed that the discharge space where the plasma is taking place is defined in the top-and-bottom direction by the conductive substrate and the high-frequency power feed section and is defined in the lateral direction by a discharge plate which is so provided as to surround the high-frequency power feed section.

High-frequency power is applied from high-frequency power sources 251 to 256 to flat-plate type high-frequency power feed sections 241 to 246 in the respective deposition chambers, to cause glow discharge to take place, whereupon source gases are decomposed and semiconductor layers are deposited on the conductive substrate 204. The high-frequency power feed sections 241 to 246 face the conductive substrate 204, and each have a height-adjusting mechanism (not shown). Operating the height-adjusting mechanism, the distance between the conductive substrate and the high-frequency power feed section can be changed and at the same time the volume of the discharge space can be changed. Gas feed pipes 231 to 236 for feeding source gases and dilute gases are also connected to the semiconductor-forming vacuum reactors 211 to 216, respectively.

On the course extending between the high-frequency power source 252 and the high-frequency power feed section 242, a direct-current powder source 257 is connected through a choke coil 258. This is used to superimpose the direct-current potential.

The deposited-film forming apparatus 201 shown in FIG. 2 has six semiconductor-forming vacuum reactors. In the present and following Examples, the glow discharge need not be caused to take place in all the semiconductor-forming vacuum reactors, and whether or not the glow discharge be taken place may be selected for each reactor in accordance with the layer construction of the photovoltaic device to be produced. Also, in each semiconductor-forming vacuum reactor, a film-forming region regulation plate (not shown) is provided in order to regulate the area of contact of the conductive substrate 204 with the discharge space in each deposition chamber so that the layer thickness of each semiconductor layer formed in each reactor can thereby be regulated.

First, before the photovoltaic device is formed, an experiment to ascertain the crystallizability of the silicon-based film was made. A belt-like substrate (50 cm wide, 200 m long and 0.125 mm thick) made of stainless steel (SUS430BA) was well degreased and cleaned, and was set in a continuous sputtering apparatus (not shown), where, using an Ag electrode as a target, an Ag thin film of 100 nm thick was vacuum-deposited by sputtering. Using a ZnO target, a ZnO thin film of 1.2 $\mu$m thick was further vacuum-deposited on the Ag thin film by sputtering, thus the belt-like conductive substrate (substrate member) 204 was formed.

Next, a bobbin wound up with the belt-like conductive substrate 204 was set in the substrate wind-off container 202, and the conductive substrate 204 was passed through the bring-in side gas gate, the semiconductor-forming vacuum reactors 211, 212, 213, 214, 215 and 216 and the bring-out side gas gate up to the substrate wind-up container 203. Its tension was regulated so that the belt-like conductive substrate 204 was not slack. Then, the insides of the substrate wind-off container 202, semiconductor-forming vacuum reactors 211, 212, 213, 214, 215 and 216 and substrate wind-up container 203 were sufficiently evacuated to a vacuum of $6.7 \times 10^{-4}$ Pa ($5 \times 10^{-6}$ Torr) by means of an evacuation system consisting of vacuum pumps (not shown).

Next, operating the evacuation system, source gases and dilute gases were fed into the semiconductor-forming vacuum reactor 212 through the gas feed pipe 232. Here, as the deposition chamber in the semiconductor-forming vacuum reactor 212, a chamber of 1 m in length in the lengthwise direction and 50 cm in width was used. Also, 200 cm$^3$/min (normal) of H$_2$ gas was fed into the semiconductor-forming vacuum reactors other than the semiconductor-forming vacuum reactor 212 through the corresponding gas feed pipes, and 500 cm$^3$/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum reactor 212 to the stated pressure. Film-forming conditions were as shown in "212 Forming conditions" in Table 1.

At the time the internal pressure of the semiconductor-forming vacuum reactor 212 became stable, the conductive substrate 204 was started to move from the substrate wind-off container 202 toward the substrate wind-up container 203.

Next, high-frequency power was applied from the high-frequency power source 252 to the high-frequency power feed section 242 in the semiconductor-forming vacuum reactor 212 to cause glow discharge to take place in the deposition chambers in the semiconductor-forming vacuum reactor 212, in which the distance between the conductive substrate and the high-frequency power feed section was kept at 9 mm by means of the height-adjusting mechanism.

Thus, a 2 $\mu$m thick silicon-based film was formed on the conductive substrate 204. Here, into the semiconductor-forming vacuum reactor 212, high-frequency power with a frequency of 60 MHz was introduced regulating its power density to come to 400 mW/cm$^3$, through the high-frequency power feed section 242, formed of a metal electrode made of aluminum.

As to the potential of the high-frequency power feed section, a direct-current potential was also superimposed on the high-frequency power to set that potential to a potential which was lower by 50 V than the ground potential. Here, the potential difference from the ground potential, produced in the substrate in the state the plasma took place under the same conditions except that the direct-current potential was not superposed on the high-frequency power and the substrate was brought into a non-grounded state, was 10 V. Thus, the potential of the substrate was higher

EXAMPLE 1-1

Next, a silicon-based film was formed in the same manner as in Example 1-1 except that the direct-current potential was not superimposed on the high-frequency power (Comparative Example 1-1).

With regard to these respective silicon-based thin-films, their diffraction peaks were measured with an X-ray diffractometer to find that the silicon-based films of Example 1-1 and Comparative Example 1-1 were both predominantly oriented to (220)-plane. However, the silicon-based film of Example 1-1 showed a higher diffraction peak intensity of (220)-plane with respect to the total sum of diffraction intensities corresponding to eleven reflections from the low-angle side. It was also ascertained that the diffraction peak had a small half width, and the film was found to have superior orientation to (220)-plane, superior crystallizability and large crystal-grain diameter. Also, the adherence between the conductive substrate and the semiconductor layer was examined by a cross cut tape test (distance between cuts: 1 mm; number of squares: 100) to find that the silicon-based film of Example 1-1 had a superior adherence to the conductive substrate.

Next, operating the evacuation system, source gases and dilute gases were fed into the semiconductor-forming vacuum reactors 211, 212 and 213 through the gas feed pipes 231, 232 and 233, respectively. Here, as the deposition chamber in the semiconductor-forming vacuum reactor 212, a chamber of 1 m in length in the lengthwise direction and 50 cm in width was used. Also, 200 cm$^3$/min (normal) of H$_2$ gas was fed into the semiconductor-forming vacuum reactors other than the semiconductor-forming vacuum reactors 211, 212 and 213 through the corresponding gas feed pipes, and 500 cm$^3$/min (normal) of H$_2$ gas was simultaneously fed as gate gas into the respective gas gates through their gate gas feed pipes (not shown). In this state, the evacuation capacity of the evacuation system was regulated to adjust the internal pressure of the semiconductor-forming vacuum reactors 211, 212 and 213 to the stated pressure. Film-forming conditions were as shown in Table 1.

At the time the internal pressure of the semiconductor-forming vacuum reactors 211, 212 and 213 became stable, the conductive substrate 204 was started to move from the substrate wind-off container 202 toward the substrate wind-up container 203.

Next, high-frequency power was applied from the high-frequency power sources 251, 252 and 253 to the high-frequency power feed sections 241, 242 and 243 in the semiconductor-forming vacuum reactors 211, 212 and 213, respectively, to cause glow discharge to take place in the deposition chambers in the semiconductor-forming vacuum reactors 211, 212 and 213. Thus, an amorphous n-type semiconductor layer (layer thickness: 30 nm), a microcrystalline i-type semiconductor layer (layer thickness: 1.5 μm), and a microcrystalline p-type semiconductor layer (layer thickness: 10 nm) were formed on the conductive substrate 204 to form a photovoltaic device.

Here, into the semiconductor-forming vacuum reactor 211, high-frequency power of 13.56 MHz in frequency and 5 mW/cm$^3$ in power density was introduced through the high-frequency power feed section 241, formed of a metal electrode made of aluminum. Into the semiconductor-forming vacuum reactor 212, in the same manner as in Example 1-1, high-frequency power of 13.56 MHz in frequency and 30 mW/cm$^3$ in power density was introduced through the high-frequency power feed section 243, formed of a metal electrode made of aluminum.

As to the potential of the high-frequency power feed section, a direct-current potential was also superimposed on the high-frequency power to set that potential to a potential which was lower by 50 V than the ground potential. Here, the potential difference from the ground potential, produced in the substrate in the state the plasma took place under the same conditions except that the direct-current potential was not superposed on the high-frequency power and the substrate was brought into a non-grounded state, was 10V. Thus, the potential of the substrate was higher.

Next, using a continuous module fabrication apparatus (not shown), the belt-like photovoltaic device thus formed was worked into solar-cell modules of 36 cm×22 cm each (Example 1-2).

Next, solar-cell modules were formed in the same manner as in Example 1-2 except that the direct-current potential was not superimposed on the high-frequency power (Comparative Example 1-2).

Photoelectric conversion efficiency of the solar-cell modules thus produced was measured with a solar simulator (AM 1.5, 100 mW/cm$^2$). As the result, the solar-cell modules of Example 1-2 were found to have 1.20-fold photoelectric conversion efficiency compared with the solar-cell modules of Comparative Example 1-2.

As can be seen from the foregoing, the solar cell comprising the semiconductor device of the present invention has superior characteristics.

EXAMPLE 2

Using the deposited-film-forming apparatus 201 shown in FIG. 2, the photovoltaic device shown in FIG. 4 was formed.

Photovoltaic devices were formed in the same manner as in Example 1 except that film-forming conditions were set as shown in Table 2 and the direct-current potential was superimposed on the high-frequency power applied to the high-frequency power feed section 242 to set the potential (V1) with respect to the ground potential of the high-frequency power feed section 242, changing its value as shown in Table 3. The belt-like photovoltaic devices thus formed were worked into solar-cell modules of 36 cm×22 cm each (Examples 2-1 to 2-6, Comparative Examples 2-1 and 2-2). Here, the potential difference from the ground potential, produced in the substrate in the state the plasma took place under the same conditions except that the direct-current potential was not superposed on the high-frequency power and the substrate was brought into a non-grounded state, was 5 V (V2). Thus, the potential of the substrate was higher.

Photoelectric conversion efficiency of the solar-cell modules thus produced was measured with a solar simulator (AM 1.5, 100 mW/cm$^2$). Also, the adherence between the conductive substrate and the semiconductor layer was examined by a cross cut tape test (distance between cuts: 1 mm; number of squares: 100). Still also, the solar-cell modules, the initial photoelectric conversion efficiency of which was previously measured, were installed in a dark place of 85° C. in temperature and 85% in relative humidity and kept there for 30 minute, which were thereafter cooled to a temperature of −20° C. over a period of 70 minutes and kept there for 30 minutes, which were then again returned to the temperature of 85° C. and relative humidity of 85% over a period of 70 minutes. This cycle was repeated 100 times, and thereafter their photoelectric conversion efficiency was measured to examine any changes in photoelectric conversion efficiency which were caused by the temperature and humidity test. Results of these are shown in Table 3.

As can be seen from Table 3, solar-cell modules comprising the photovoltaic device produced under the condition of $|V2| \leq |V1| \leq 50 \times |V2|$ show superior results in all items of photoelectric conversion efficiency, peel test and temperature and humidity test, and, in particular, solar-cell modules comprising the photovoltaic device produced under the condition of $2 \times |V2| \leq |V1| \leq 30 \times |V2|$ have superior features especially against the peel test.

As can be seen from the foregoing, the solar-cell module comprising the semiconductor device of the present invention has superior features.

EXAMPLE 3

Using the deposited-film-forming apparatus 201 shown in FIG. 2, the photovoltaic device shown in FIG. 4 was formed in the following way. FIG. 4 is a diagrammatic sectional view showing an example of a photovoltaic device having the silicon-based film of the present invention. In FIG. 4, the same members as those shown in FIG. 1 are denoted by the like reference numerals to avoid repeating the description. The semiconductor layer of this photovoltaic device consists of an amorphous n-type semiconductor layer 102-1A, a microcrystalline i-type semiconductor layer 102-2A and a microcrystalline p-type semiconductor layer 102-3A. Namely, this photovoltaic device is what is called a p-i-n type single-cell photovoltaic device.

The procedure in Example 1 was repeated up to the starting of the conductive substrate 204 to move.

Next, high-frequency power was applied from the high-frequency power sources 251, 252 and 253 to the high-frequency power feed sections 241, 242 and 243 in the semiconductor-forming vacuum reactors 211, 212 and 213, respectively, to cause glow discharge to take place in the deposition chambers in the semiconductor-forming vacuum reactors 211, 212 and 213. Thus, an amorphous n-type semiconductor layer (layer thickness: 30 nm), a microcrystalline i-type semiconductor layer and a microcrystalline p-type semiconductor layer (layer thickness: 10 nm) were formed on the conductive substrate 204 to form a photovoltaic device. Here, the microcrystalline i-type semiconductor layer was formed changing its layer thickness, regulating the thickness by means of the film-forming region regulation plate.

Film-forming conditions in the semiconductor-forming vacuum reactors 211, 212 and 213 were as shown in Table 4. Here, into the semiconductor-forming vacuum reactor 211, high-frequency power of 13.56 MHz in frequency and 5 mW/cm$^3$ in power density was introduced through the high-frequency power feed section 241, formed of a metal electrode made of aluminum. Into the semiconductor-forming vacuum reactor 212, high-frequency power with a frequency of 100 MHz was introduced regulating its power density to come to 100 mW/cm$^3$, through the high-frequency power feed section 242, formed of a metal electrode made of aluminum. Into the semiconductor-forming vacuum reactor 213, high-frequency power of 13.56 MHz in frequency and 30 mW/cm$^3$ in power density was introduced through the high-frequency power feed section 243, formed of a metal electrode made of aluminum. Here, the distance between the conductive substrate and the high-frequency power feed section was kept at 9 mm by means of the height-adjusting mechanism provided in the high-frequency power feed section 242.

As to the potential of the high-frequency power feed section 242, a direct-current potential was also superimposed on the high-frequency power to set that potential to a potential which was lower by 70 V than the ground potential. Here, the potential difference from the ground potential, produced in the substrate in the state the plasma took place under the same conditions except that the direct-current potential was not superposed on the high-frequency power and the substrate was brought into a non-grounded state, was 5 V. Thus, the potential of the substrate was higher.

In this Example, the photovoltaic devices were formed in which the microcrystalline i-type semiconductor layer was formed for each layer thickness shown in Table 5, regulating the thickness by means of the film-forming region regulation plate provided in the semiconductor-forming vacuum reactor 212.

Next, using a continuous module fabrication apparatus (not shown), the belt-like photovoltaic devices thus formed were worked into solar-cell modules of 36 cm×22 cm each (Examples 3-1, 3-2, 3-3, 3-4 and 3-5).

Next, solar-cell modules were formed in the same manner as in Examples 3-1 to 3-5 except that the direct-current potential was not superimposed on the high-frequency power (Comparative Examples 3-1, 3-2, 3-3, 3-4 and 3-5).

Photoelectric conversion efficiency of the solar-cell modules thus produced was measured with a solar simulator (AM 1.5, 100 mW/cm$^2$). Also, the solar-cell modules, the initial photoelectric conversion efficiency of which was previously measured, were installed in a dark place of 85° C. in temperature and 85% in relative humidity and kept there for 30 minute, which were thereafter cooled to a temperature of −20° C. over a period of 70 minutes and kept there for 30 minutes, which were then again returned to the temperature of 85° C. and relative humidity of 85% over a period of 70 minutes. This cycle was repeated 100 times, and thereafter their photoelectric conversion efficiency was measured to examine any changes in photoelectric conversion efficiency which were caused by the temperature and humidity test. The value of fill factor of the initial photoelectric conversion efficiency and the results of the temperature and humidity test are shown in Table 6.

The solar cells of this Example had a higher fill factor than the solar cells of Comparative Examples, little decreased in the fill factor with increase in the layer thickness, and were seen not to cause any lowering of the photoelectric conversion efficiency.

As can be seen from the foregoing, the solar cell comprising the semiconductor device of the present invention has superior characteristics.

EXAMPLE 4

Using the deposited-film-forming apparatus 201 shown in FIG. 2, the photovoltaic device shown in FIG. 4 was formed in the following way. FIG. 4 is a diagrammatic sectional view showing an example of a photovoltaic device having the silicon-based film of the present invention. In FIG. 4, the same members as those shown in FIG. 1 are denoted by the like reference numerals to avoid repeating the description. The semiconductor layer of this photovoltaic device consists of an amorphous n-type semiconductor layer 102-1A, a microcrystalline i-type semiconductor layer 102-2A and a microcrystalline p-type semiconductor layer 102-3A. Namely, this photovoltaic device is what is called a p-i-n type single-cell photovoltaic device.

The procedure in Example 1 was repeated up to the starting of the conductive substrate 204 to move.

Next, high-frequency power was applied from the high-frequency power sources 251, 252 and 253 to the high-frequency power feed sections 241, 242 and 243 in the semiconductor-forming vacuum reactors 211, 212 and 213, respectively, to cause glow discharge to take place in the deposition chambers in the semiconductor-forming vacuum reactors 211, 212 and 213. Thus, an amorphous n-type semiconductor layer (layer thickness: 30 nm), a microcrystalline i-type semiconductor layer (layer thickness: 2.0 μm) and a microcrystalline p-type semiconductor layer (layer thickness: 10 nm) were formed on the conductive substrate 204 to form a photovoltaic device. Here, the microcrystalline i-type semiconductor layer was formed changing the high-frequency power density.

Film-forming conditions in the semiconductor-forming vacuum reactors 211, 212 and 213 were as shown in Table 7. Here, into the semiconductor-forming vacuum reactor 211, high-frequency power of 13.56 MHz in frequency and 5 mW/cm$^3$ in power density was introduced through the high-frequency power feed section 241, formed of a metal electrode made of aluminum. Into the semiconductor-forming vacuum reactor 212, high-frequency power with a frequency of 100 MHz was introduced changing its power density as shown in Table 8, through the high-frequency power feed section 242, formed of a metal electrode made of aluminum. Into the semiconductor-forming vacuum reactor 213, high-frequency power of 13.56 MHz in frequency and 30 mW/cm$^3$ in power density was introduced through the high-frequency power feed section 243, formed of a metal electrode made of aluminum.

A direct-current potential was also superimposed on the high-frequency power to set the potential of the high-frequency power feed section 242 so as to come to V1=10× V2 at each powder density, where V1 is the potential of the high-frequency power feed section 242 and V2 is the potential difference from the ground potential, produced in the electrode in the state the plasma has taken place under the same conditions except that the direct-current potential is not superposed on the high-frequency power and the electrode is brought into a non-grounded state. Thus, the potential of the high-frequency power feed section 242 was set lower than the ground potential.

Here, the distance between the conductive substrate and the high-frequency power feed section was kept at 9 mm by means of the height-adjusting mechanism provided in the high-frequency power feed section 242. Also, when the i-type semiconductor layer was formed, its layer thickness was so regulated as to be 2.0 μm by means of the film-forming region regulation plate.

Next, using a continuous module fabrication apparatus (not shown), the belt-like photovoltaic devices thus formed were worked into solar-cell modules of 36 cm×22 cm each (Examples 4-1, 4-2, 4-3, 4-4, 4-5, 4-6 and 4-7).

Next, solar-cell modules were formed in the same manner as in Examples 4-1 to 4-7 except that the direct-current potential was not superimposed on the high-frequency power (Comparative Examples 4-1, 4-2, 4-3, 4-4, 4-5, 4-6 and 4-7).

Photoelectric conversion efficiency of the solar-cell modules thus produced was measured with a solar simulator (AM 1.5, 100 mW/cm$^2$). Also, the adherence between the conductive substrate and the semiconductor layer was examined by a cross cut tape test (distance between cuts: 1 mm; number of squares: 100). Still also, the solar-cell modules, the initial photoelectric conversion efficiency of which was previously measured, were installed in a dark place of 85° C. in temperature and 85% in relative humidity and kept there for 30 minute, which were thereafter cooled to a temperature of −20° C. over a period of 70 minutes and kept there for 30 minutes, which were then again returned to the temperature of 85° C. and relative humidity of 85% over a period of 70 minutes. This cycle was repeated 100 times, and thereafter their photoelectric conversion efficiency was measured to examine any changes in photoelectric conversion efficiency which were caused by the temperature and humidity test. The results of these are shown in Table 9.

The solar cells of this Example showed a high initial photoelectric conversion efficiency, had a superior adherence and did not cause any lowering of the photoelectric conversion efficiency even in the above temperature and humidity environment. Also, the solar cells of Examples 4-2, 4-3, 4-4, 4-5 and 4-6 showed especially superior initial photoelectric conversion efficiency, and those of Examples 4-3, 4-4 and 4-5 showed especially good results in the peel test.

As can be seen from the foregoing, the solar cell comprising the semiconductor device of the present invention has superior characteristics.

EXAMPLE 5

Figure 5:
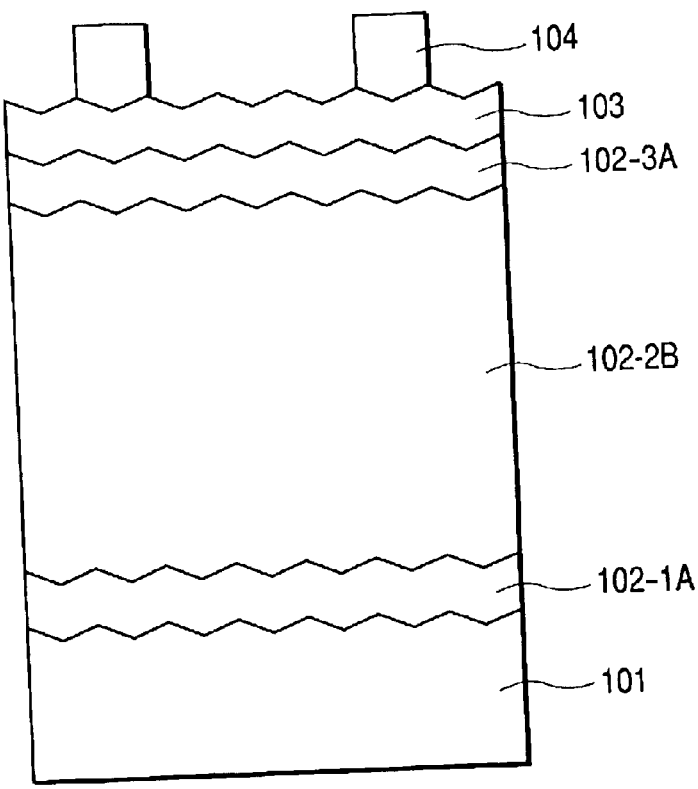
FIG. 5 is a diagrammatic sectional view showing still another example of a photovoltaic device having the semiconductor device of the present invention.

Using the deposited-film-forming apparatus 201 shown in FIG. 2, the photovoltaic device shown in FIG. 5 was formed in the following way. FIG. 5 is a diagrammatic sectional view showing an example of a photovoltaic device having the silicon-based film of the present invention. In FIG. 5, the same members as those shown in FIG. 1 are denoted by the like reference numerals to avoid repeating the description. The semiconductor layer of this photovoltaic device consists of an amorphous n-type semiconductor layer 102-1A, an amorphous i-type semiconductor layer 102-2B, and a microcrystalline p-type semiconductor layer 102-3A. Namely, this photovoltaic device is what is called a p-i-n type single-cell photovoltaic device.

The procedure in Example 1 was repeated up to the starting of the conductive substrate 204 to move.

Next, high-frequency power was applied from the high-frequency power sources 251, 252 and 253 to the high-frequency power feed sections 241, 242 and 243 in the semiconductor-forming vacuum reactors 211, 212 and 213, respectively, to cause glow discharge to take place in the deposition chambers in the semiconductor-forming vacuum reactors 211, 212 and 213. Thus, an amorphous n-type semiconductor layer (layer thickness: 30 nm), an amorphous i-type semiconductor layer (layer thickness: 300 nm) and a microcrystalline p-type semiconductor layer (layer thickness: 10 nm) were formed on the conductive substrate 204 to form a photovoltaic device.

Film-forming conditions in the semiconductor-forming vacuum reactors 211, 212 and 213 were as shown in Table 10. Here, into the semiconductor-forming vacuum reactor 211, high-frequency power of 13.56 MHz in frequency and 5 mW/cm$^3$ in power density was introduced through the high-frequency power feed section 241, formed of a metal electrode made of aluminum. Into the semiconductor-forming vacuum reactor 212, high-frequency power with a frequency of 100 MHz was introduced regulating its power density to come to 100 mW/cm$^3$, through the high-frequency power feed section 242, formed of a metal electrode made of aluminum. Into the semiconductor-forming vacuum reactor 213, high-frequency power of 13.56 MHz in frequency and 30 mW/cm$^3$ in power density was introduced through the high-frequency power feed section 243, formed of a metal electrode made of aluminum. Here, the distance between the conductive substrate and the high-frequency power feed section was kept at 9 mm by means of the height-adjusting mechanism provided in the semiconductor-forming vacuum reactor 212.

As to the potential of the high-frequency power feed section 242, a direct-current potential was also superimposed on the high-frequency power to set that potential to a potential which was lower by 20 V than the ground potential. Here, the potential difference from the ground potential, produced in the substrate in the state the plasma took place under the same conditions except that the direct-current potential was not superposed on the high-frequency power and the substrate was brought into a non-grounded state, was 3 V. Thus, the potential of the substrate was higher.

Next, using a continuous module fabrication apparatus (not shown), the belt-like photovoltaic devices thus formed were worked into solar-cell modules of 36 cm×22 cm each. Ten modules having the like size were prepared, picking them at different positions on the conductive substrate (Example 5)

Next, solar-cell modules were formed in the same manner as in Example 5 except that the direct-current potential was not superimposed on the high-frequency power (Comparative Example 5).

Photoelectric conversion efficiency of the solar-cell modules thus produced in this Example and Comparative Example was measured with a solar simulator (AM 1.5, 100 mW/cm$^2$). As the result, in comparison of average photoelectric conversion efficiency between the solar-cell modules of this Example and Comparative Example, those of this Example showed a value of 1.1 times those of Comparative Example. Any scattering in photoelectric conversion efficiency of these solar-cell modules was examined to find that those of this Example showed smaller scattering.

As can be seen from the foregoing, the solar cell comprising the semiconductor device of the present invention has superior characteristics.

EXAMPLE 6

Using the deposited-film-forming apparatus 201 shown in FIG. 2, the photovoltaic device shown in FIG. 4 was formed.

Photovoltaic devices were formed in the same manner as in Example 4-3 except that, as the SiF$_4$ gas introduced into the semiconductor-forming vacuum reactor 213, SiF$_4$ gas incorporated with oxygen as shown in Table 11 was used. Using a continuous module fabrication apparatus (not shown), the belt-like photovoltaic devices thus formed were worked into solar-cell modules of 36 cm×22 cm each (Examples 6-1, 6-2, 6-3 and 6-4).

Photoelectric conversion efficiency of the solar-cell modules thus produced was measured with a solar simulator (AM 1.5, 100 mW/cm$^2$). Also, the solar-cell modules, the initial photoelectric conversion efficiency of which was previously measured, were installed in a dark place of 85° C. in temperature and 85% in relative humidity and kept there for 30 minute, which were thereafter cooled to a temperature of −20° C. over a period of 70 minutes and kept there for 30 minutes, which were then again returned to the temperature of 85° C. and relative humidity of 85% over a period of 70 minutes. This cycle was repeated 100 times, and thereafter their photoelectric conversion efficiency was measured to examine any changes in photoelectric conversion efficiency which were caused by the temperature and humidity test. Also, the respective solar-cell modules were examined by SIMS (secondary ion mass spectroscopy) to evaluate oxygen concentration contained in the silicon-based film formed in the semiconductor-forming vacuum reactor 213. The results of these are shown in Table 12.

As can be seen from the foregoing, the solar cell comprising the semiconductor device of the present invention has superior characteristics. Also, those in which the oxygen concentration in the film was 1.5×10$^{18}$ atoms/cm$^3$ or more to 5.0×10$^{19}$ atoms/cm$^3$ or less were especially superior.

EXAMPLE 7

Using the deposited-film-forming apparatus 201 shown in FIG. 2, the photovoltaic device shown in FIG. 4 was formed.

Photovoltaic devices were formed in the same manner as in Example 4-3 except that, in the semiconductor-forming vacuum reactor 212, the distance between the conductive substrate and the high-frequency power feed section was changed as shown in Table 13 by means of the height-adjusting mechanism. The belt-like photovoltaic devices thus formed were worked into solar-cell modules of 36 cm×22 cm each.

Photoelectric conversion efficiency of the solar-cell modules thus produced was measured with a solar simulator (AM 1.5, 100 mW/cm$^2$). The results are shown in Table 13. Here, the i-type semiconductor layer formed setting the above distance to 2 mm had a poor uniformity in layer thickness, and caused a great scattering in photoelectric conversion efficiency for each solar-cell module. Then, the solar-cell modules having i-type semiconductor layers formed setting the distance between the conductive substrate and the high-frequency power feed section to 3 mm or more to 30 mm or less showed superior photoelectric conversion efficiency.

As can be seen from the foregoing, the solar cell comprising the semiconductor device of the present invention has superior characteristics.

EXAMPLE 8

Using the deposited-film-forming apparatus 201 shown in FIG. 2, the photovoltaic device shown in FIG. 4 was formed.

Photovoltaic devices were formed in the same manner as in Example 4-3 except that the internal pressure of the semiconductor-forming vacuum reactor 213 was changed as shown in Table 14. The belt-like photovoltaic devices thus formed were worked into solar-cell modules of 36 cm×22 cm each.

Photoelectric conversion efficiency of the solar-cell modules thus produced was measured with a solar simulator (AM 1.5, 100 mW/cm$^2$). Also, the adherence between the conductive substrate and the semiconductor layer was examined by a cross cut tape test (distance between cuts: 1 mm; number of squares: 100). Still also, the solar-cell modules, the initial photoelectric conversion efficiency of which was previously measured, were installed in a dark place of 85° C. in temperature and 85% in relative humidity and kept there for 30 minute, which were thereafter cooled to a temperature of −20° C. over a period of 70 minutes and kept there for 30 minutes, which were then again returned to the temperature of 85° C. and relative humidity of 85% over a period of 70 minutes. This cycle was repeated 100 times, and thereafter their photoelectric conversion efficiency was measured to examine any changes in photoelectric conversion efficiency which were caused by the temperature and humidity test. The results of these are shown in Table 14.

As can be seen from Table 14, solar-cell modules comprising semiconductor devices produced setting the internal pressure of the semiconductor-forming vacuum reactor 213 to 90 Pa or more to 15,000 Pa or less show superior results in all items of photoelectric conversion efficiency, peel test and temperature and humidity test, and, in particular, solar-cell modules comprising the photovoltaic device produced setting the internal pressure to 100 Pa or more to 5,000 Pa or less have superior features especially against the peel test. As can be seen from the foregoing, the solar-cell module comprising the semiconductor device of the present invention has superior features.

EXAMPLE 9

Using the deposited-film-forming apparatus 201 shown in FIG. 2, the photovoltaic device shown in FIG. 4 was formed.

Photovoltaic devices were formed in the same manner as in Example 4-3 except that the residence time in the semiconductor-forming vacuum reactor 212 was changed as shown in Table 15. The belt-like photovoltaic devices thus formed were worked into solar-cell modules of 36 cm×22 cm each.

As can be seen from Table 15, solar-cell modules comprising semiconductor devices produced setting the residence time in the semiconductor-forming vacuum reactor 212 to 0.01 second or more to 10 seconds or less show superior results in all items of photoelectric conversion efficiency, peel test and temperature and humidity test, and, in particular, solar-cell modules comprising the photovoltaic device produced setting the residence time to 0.1 second or more to 3.5 seconds or less have superior features especially against the peel test. As can be seen from the foregoing, the solar-cell module comprising the semiconductor device of the present invention has superior features.

EXAMPLE 10

Figure 6:
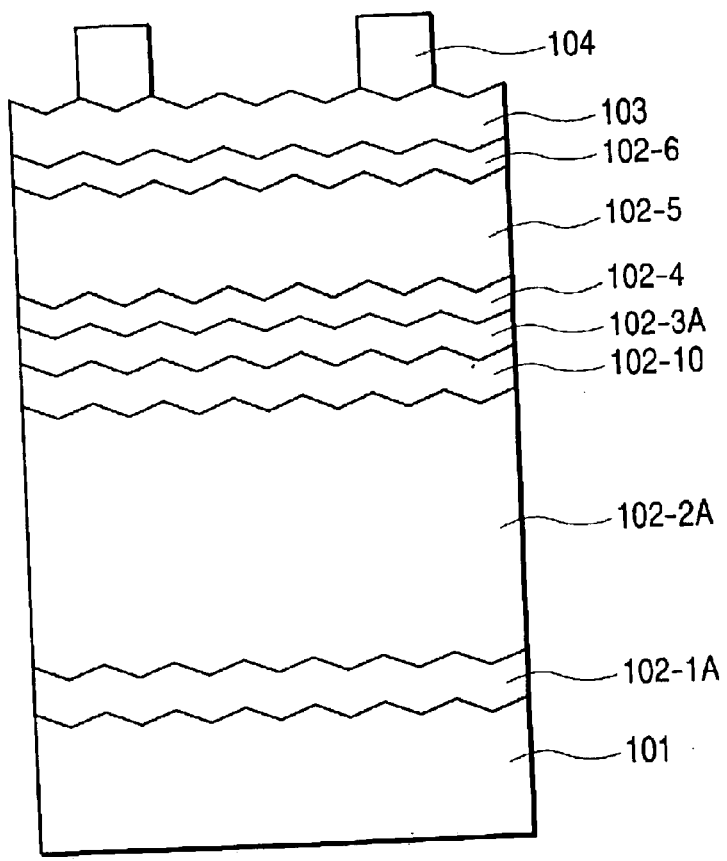
FIG. 6 is a diagrammatic sectional view showing a further example of a photovoltaic device having the semiconductor device of the present invention.

Using the deposited-film-forming apparatus 201 shown in FIG. 2, the photovoltaic device shown in FIG. 6 was formed in the following way. FIG. 6 is a diagrammatic sectional view showing an example of a photovoltaic device having the silicon-based film of the present invention. In FIG. 6, the same members as those shown in FIG. 1 are denoted by the like reference numerals to avoid repeating the description. The semiconductor layer of this photovoltaic device consists of amorphous n-type semiconductor layers 102-1A and 102-4, a microcrystalline i-type semiconductor layer 102-2A, an amorphous i-type semiconductor layer 102-5, an amorphous silicon layer 102-10, and microcrystalline p-type semiconductor layers 102-2A and 102-6. Namely, this photovoltaic device is what is called a p-i-n p-i-n type double-cell photovoltaic device.

In the same manner as in Example 1, a belt-like conductive substrate 204 was prepared and was set in the deposited-film-forming apparatus 201. Then, the insides of the substrate wind-off container 202, semiconductor-forming vacuum reactors 211, 212, 213, 214, 215 and 216 and substrate wind-up container 203 were sufficiently evacuated to a vacuum of $6.7 \times 10^{-4}$ Pa ($5 \times 10^{-6}$ Torr) by means of an evacuation system consisting of vacuum pumps (not shown).

Next, operating the evacuation system, source gases and dilute gases were fed into the semiconductor-forming vacuum reactors 211 to 216 through the gas feed pipes 231 to 236, respectively. Here, as the deposition chamber in the semiconductor-forming vacuum reactor 212, a chamber of 1 m in length in the lengthwise direction and 50 cm in width was used. Also, 500 cm$^3$/min (normal) of H$_2$ gas was fed as gate gas into the respective gas gates through their gate gas feed pipes (not shown). In this state, the evacuation capacity of the evacuation system was regulated to adjust the internal pressure of the semiconductor-forming vacuum reactors 211 to 216 to the stated pressure. Films were formed under the same conditions as those in Example 2-3 in respect of the semiconductor-forming vacuum reactors 211 to 213, and in respect of the semiconductor-forming vacuum reactors 214 to 216, under conditions shown in Table 16.

At the time the internal pressure of the semiconductor-forming vacuum reactors 211 to 216 became stable, the conductive substrate 204 was started to move from the substrate wind-off container 202 toward the substrate wind-up container 203.

Next, high-frequency power was applied from the high-frequency power sources 251 to 256 to the high-frequency power feed sections 241 to 246 in the semiconductor-forming vacuum reactors 211 to 216, respectively, to cause glow discharge to take place in the deposition chambers in the semiconductor-forming vacuum reactors 211 to 216. Thus, an amorphous n-type semiconductor layer (layer thickness: 30 nm), a microcrystalline i-type semiconductor layer (layer thickness: 2.0 μm), a microcrystalline p-type semiconductor layer (layer thickness: 10 nm), an amorphous n-type semiconductor layer (layer thickness: 30 nm), an amorphous i-type semiconductor layer (layer thickness: 300 nm) and a microcrystalline p-type semiconductor layer (layer thickness: 10 nm) were formed on the conductive substrate 204 to form a photovoltaic device.

Here, into the semiconductor-forming vacuum reactors 211 and 214, high-frequency power of 13.56 MHz in frequency and 5 mW/cm$^3$ in power density was introduced through the high-frequency power feed sections 241 and 244, respectively, each formed of a metal electrode made of aluminum. Into the semiconductor-forming vacuum reactor 212, high-frequency power with a frequency of 60 MHz was introduced regulating its power density to come to 400 mW/cm$^3$, through the high-frequency power feed section 242, formed of a metal electrode made of aluminum. Into the semiconductor-forming vacuum reactor 215, high-frequency power with a frequency of 60 MHz was introduced regulating its power density to come to 300 mW/cm$^3$, through the high-frequency power feed section 245, formed of a metal electrode made of aluminum. Into the semiconductor-forming vacuum reactors 213 and 216, high-frequency power of 13.56 MHz in frequency and 30 mW/cm$^3$ in power density was introduced through the high-frequency power feed sections 243 and 246, respectively, each formed of a metal electrode made of aluminum.

Next, using a continuous module fabrication apparatus (not shown), the belt-like photovoltaic device thus formed was worked into solar-cell modules of 36 cm×22 cm each.

Here, as to the potential of the high-frequency power feed section 242, a direct-current potential was superimposed on the high-frequency power to set that potential to a potential which was lower by 50 V than the ground potential. The potential difference from the ground potential, produced in the substrate in the state the plasma took place under the same conditions except that the direct-current potential was not superposed on the high-frequency power and the substrate was brought into a non-grounded state, was 5 V (V2). Thus, the potential of the substrate was higher.

Photoelectric conversion efficiency of the solar-cell modules thus produced was measured with a solar simulator (AM 1.5, 100 mW/cm$^2$). As the result, compared with the single-cell solar-cell modules in Example 2-3, the modules in this Example showed a 1.23-fold value of photoelectric conversion efficiency. They also showed good results on the peel test and the temperature and humidity test. As can be seen from the foregoing, the solar cell comprising the semiconductor device of the present invention has superior features.

EXAMPLE 11

Figure 7:
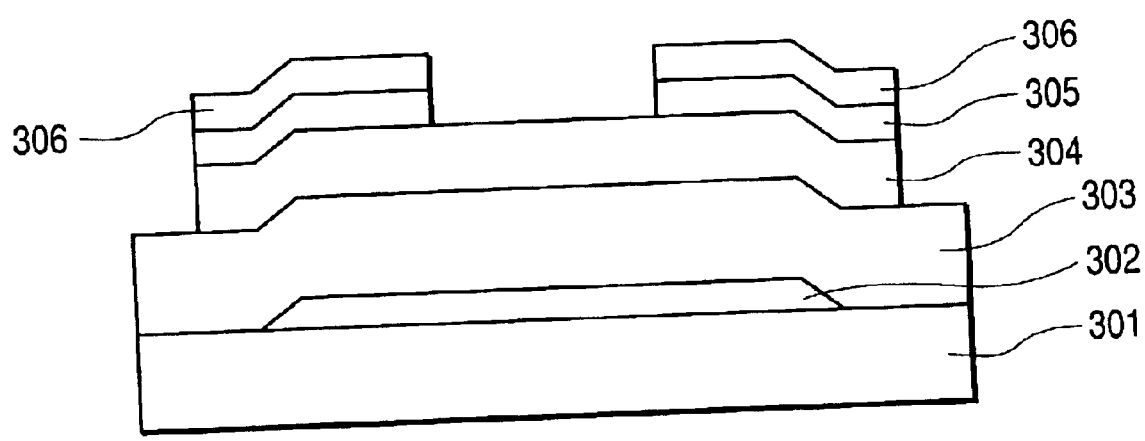
FIG. 7 is a diagrammatic sectional view showing an example of a TFT having the semiconductor device of the present invention.

A reverse stagger type TFT was formed according to the procedure shown below. FIG. 7 is a diagrammatic sectional view showing an example of a reverse stagger type TFT having the semiconductor device of the present invention. It is so constructed that, using a glass substrate as an insulating substrate, a gate electrode 302 is formed thereon, and further a gate insulating film 303, an active layer 304 formed of an undoped silicon layer, a source on the active layer 304, an ohmic contact layer 305 comprising a low-resistance n$^+$-type amorphous silicon in the drain region, and also source-drain electrodes 306 are formed.

First, on the glass substrate 301, an Mo—Ta alloy film layer was formed by sputtering, followed by patterning to form the gate electrode 302. Next, a gate insulating film 303 comprising silicon oxide film was formed by CVD. Thereafter, in the semiconductor-forming vacuum reactor 212 shown in FIG. 2, an opposing electrode capable of being electrically grounded was disposed, and the glass substrate was set on this opposing electrode, where an active layer 304 of 80 nm thick was formed under the conditions in Example 1-1. Next, this glass substrate with the active layer was set in the semiconductor-forming vacuum reactor 211, and an ohmic contact layer 305 comprising an n$^+$-type amorphous silicon was deposited thereon, followed by patterning through a lithographic process. A metal film was further formed and patterned to form the source-drain electrodes 306. Finally, using a mixed gas of CF$_4$ and O$_2$, the ohmic contact layer 305 standing uncovered between the source-drain electrodes 306 was etched away to form the TFT (Example 11).

A TFT was formed in the same manner as in Example 12 except that the active layer 304 was formed under the conditions in Comparative Example 1-1 (Comparative Example 11).

In the TFT of Example 11, any excess etching of the active layer 304 did no occur when the ohmic contact layer 305 was etched. However, in the TFT of Comparative Example 11, excess etching occurred slightly to make the active layer thin and its layer thickness non-uniform. Also, such damage by etching caused a leak path in the active layer, resulting in a greater value of off-current than that in Example 11.

As can be seen from the foregoing, the TFT comprising the semiconductor device of the present invention has superior features.

As described above, the silicon-based film formation process of the present invention enables formation of silicon-based films having less defect density even in high-rate film formation.

The silicon-based film of the present invention can be formed with less defect density and at a low cost.

The semiconductor device of the present invention can have good electrical characteristics, can have superior adherence and environmental resistance, and can be formed at a low cost.

In the case when the V1 is within the range of $2\times|V2|\leq|V1|\leq 30\times|V2|$, silicon-based films having much less defect density can be formed by higher-rate film formation.

In the case when the direct-current powder source is connected through the choke coil onto the circuit which connects the high-frequency power feed section and the high-frequency power source, the direct-current potential can be superimposed in simple structure and good controllability.

In the case when the roll-to-roll method is used to form the films, a large-area device can continuously be formed. Also, since it is difficult to maintain the potential of the substrate to a different potential for each of the plurality of semiconductor-forming vacuum reactors, it is especially effective to superimpose the direct-current potential on the high-frequency power applied to the high-frequency power feed section to control the plasma potential.

The application of the high-frequency power with a frequency of from 20 MHz to 500 MHz enables introduction of uniform high-frequency output into the plasma space.

The application of the high-frequency power with a frequency of from 30 MHz to 150 MHz enables introduction of more uniform high-frequency output into the plasma space.

In the case when the silicon-based film is the silicon-based film containing a crystal phase, the crystal-phase silicon has characteristics such that it has a lower defect density of Si—Si bonds than the amorphous-phase silicon and has a greater carrier mobility and a longer recombination lifetime than any amorphous-phase silicon standing non-equilibrium thermodynamically. It also has superior stability in characteristics over a long time and also has a strong point that its characteristics may hardly change even in an environment of high temperature and high humidity. Hence, in the semiconductor device having a semiconductor junction formed of a silicon-based film, a semiconductor device having much superior characteristics and also superior stability can be formed using in, e.g., photovoltaic devices or TFTs the silicon-based film containing a crystal phase.

In the case when the silicon-based film contains the region in which the diffraction intensity of the (220)-plane, measured by X-ray or electron-ray diffraction of the crystal phase, is in a proportion of 80% or more with respect to the total diffraction intensity, silicon-based layers having good adherence in fine crystals and between fine crystals one another and good weatherability can be formed. Also, in the case when the TFT of a reverse stagger type is used, the ohmic contact layer can completely be removed without etching the active layers when the ohmic contact layer is dry-etched in the course of the formation of the film, which layer can be removed without use of any etching stopper materials such as nitride film.

Since the source gas may contain at least one of silicon hydride and silicon fluoride, and hydrogen, the activated hydrogen can be formed in a larger quantity in the atmosphere having increased in electron density in the plasma, the plasma density per unit discharge space volume can be made higher, and high-rate film formation can be materialized as a total.

Since the distance between the high-frequency power feed section and the substrate may be from 3 mm to 30 mm, silicon-based films having superior characteristics with less defect density can be formed at much higher rate.

Since the silicon-based film may be formed under a pressure of from 100 Pa (0.75 Torr) to 5,000 Pa (37.5 Torr), silicon-based films having superior characteristics with much less defect density can be formed at much higher rate.

Since in forming the silicon-based film the source gas may be fed at a residence time τ of from 0.01 second to 10 seconds, plasma having the desired plasma atmosphere can be formed, and silicon-based films having a high quality (less defect density) can be obtained.

In the case when the film residence time τ is from 0.1 second to 3 seconds in forming the silicon-based film, the influence on an underlying layer can be lessened, and the adherence, the environmental resistance and the effect of lowering photodeterioration rate can be improved.

In the case when the high-frequency power density is from 0.1 W/cm$^3$ to 2 W/cm$^3$ in forming the silicon-based film, silicon-based films having less defect density over a large area can be formed. Also, in the case when it is from 0.1 W/cm$^3$ to 1 W/cm$^3$, the influence on an underlying layer can be lessened, and the adherence, the environmental resistance and the effect of lowering photodeterioration rate can be provided.

In the case when the silicon-based film contains at least one of oxygen atoms, carbon atoms and nitrogen atoms, which may be in a total content of from $1.5\times10^{18}$ atoms/cm$^3$ to $5.0\times10^{19}$ atoms/cm$^3$, such atoms, when arranged at crystal grain boundaries or in void-like spaces in amorphous structure, can improve structural stability. Also, any new crystal nuclei can be kept from being produced on the growth plane, bringing about the effect of improving the uniformity of cross-sectional size of fine crystals.

In the case when the silicon-based film contains from $1.0\times10^{19}$ atoms/cm$^3$ to $2.5\times10^{20}$ atoms/cm$^3$ of fluorine atoms, the grain boundaries of fine crystals and any structurally mismatched regions of amorphous structure can be passivated in a good efficiency, and also fluorine atoms, which have a great electronegativity, can inactivate the silicon atoms' dangling bonds standing revealed at grain boundaries of fine crystals.

As to the semiconductor device, in the case when it is a semiconductor device having at least one set of a p-i-n semiconductor junction in which a semiconductor layer showing a first conductivity type, an i-type semiconductor layer and a semiconductor layer showing a second conductivity type are superposed in order, devices having high photoelectric conversion efficiency and superior adherence and weatherability can be obtained.

In the case when the semiconductor device is the TFT device of a reverse stagger type, devices having uniform layer thickness and low off-current can be obtained.

TABLE 1

211 Forming conditions:

| | |
|---|---|
| Source gases: | SiH$_4$: 20 cm$^3$/min (normal) |
| | H$_2$: 100 cm$^3$/min (normal) |
| | PH$_3$ (2%-diluted with H$_2$): |
| | 30 cm$^3$/min (normal) |
| Substrate temp.: | 300° C. |
| Pressure: | 133 Pa (1.0 Torr) |

212 Forming conditions:

| | |
|---|---|
| Source gases: | SiH$_4$:SiF$_4$:H$_2$ = 1:5:15 |
| | τ = 0.4 second |
| Substrate temp.: | 350° C. |
| Pressure: | 400 Pa (3.0 Torr) |

213 Forming conditions:

| | |
|---|---|
| Source gases: | SiH$_4$: 10 cm$^3$/min (normal) |
| | H$_2$: 800 cm$^3$/min (normal) |
| | BF$_3$ (2%-diluted with H$_2$): |
| | 100 cm$^3$/min (normal) |
| Substrate temp.: | 200° C. |
| Pressure: | 160 Pa (1.2 Torr) |

TABLE 2

211 Forming conditions:

| | |
|---|---|
| Source gases: | SiH$_4$: 20 cm$^3$/min (normal) |
| | H$_2$: 100 cm$^3$/min (normal) |
| | PH$_3$ (2%-diluted with H$_2$): |
| | 30 cm$^3$/min (normal) |
| Substrate temp.: | 300° C |
| Pressure: | 133 Pa (1.0 Torr) |

212 Forming conditions:

| | |
|---|---|
| Source gases: | SiH$_4$:SiF$_4$:H$_2$ = 1:4:10 |
| | τ = 0.4 second |
| Substrate temp.: | 300° C. |
| Pressure: | 800 Pa (6.0 Torr) |

213 Forming conditions:

| | |
|---|---|
| Source gases: | SiH$_4$: 10 cm$^3$/min (normal) |
| | H$_2$: 800 cm$^3$/min (normal) |
| | BF$_3$ (2%-diluted with H$_2$): |
| | 100 cm$^3$/min (normal) |
| Substrate temp.: | 200° C. |
| Pressure: | 160 Pa (1.2 Torr) |

TABLE 3

| | Comparative Example 2-1 | Example 2-1 | Example 2-2 | Example 2-3 | Example 2-4 | Example 2-5 | Example 2-6 | Comparative Example 2-2 |
|---|---|---|---|---|---|---|---|---|
| V1 (V): | +5 | −5 | −10 | −50 | −150 | −200 | −250 | −300 |
| V2 (V): | +5 | +5 | +5 | +5 | +5 | +5 | +5 | +5 |
| Photoelectric conversion efficiency: | 1 | 1.20 | 1.30 | 1.32 | 1.34 | 1.30 | 1.25 | 0.95 |
| Peel test: | B | A | AA | AA | AA | A | A | C |
| Temperature humidity test: | 0.70 | 0.90 | 1.0 | 1.0 | 1.0 | 0.95 | 0.9 | 0.75 |

In Comparative Example 2-1, the potential of the high-frequency power feed section is set to a potential higher than that of the substrate.

The photoelectric conversion efficiency is based on the value found by standardizing as 1 the value found when the internal pressure of the semiconductor-forming reactor 213 is 50 Pa.

The peel test means that the number of squares having peeled is AA: 0, A: 1 or 2, B: 3 to 10, and C: 11 to 100.

The temperature humidity test is evaluated as the value of (photoelectric conversion efficiency after test)/(photoelectric conversion efficiency before test).

TABLE 4

211 Forming conditions:

| | |
|---|---|
| Source gases: | SiH$_4$: 20 cm$^3$/min (normal) |
| | H$_2$: 100 cm$^3$/min (normal) |
| | PH$_3$ (2%-diluted with H$_2$): |
| | 30 cm$^3$/min (normal) |
| Substrate temp.: | 300° C. |
| Pressure: | 133 Pa (1.0 Torr) |

212 Forming conditions:

| | |
|---|---|
| Source gases: | SiF$_4$:H$_2$ = 1:5 |
| | τ = 0.5 second |
| Substrate temp.: | 300° C. |
| Pressure: | 200 Pa (1.5 Torr) |

213 Forming conditions:

| | |
|---|---|
| Source gases: | SiH$_4$: 10 cm$^3$/min (normal) |
| | H$_2$: 800 cm$^3$/min (normal) |
| | BF$_3$ (2%-diluted with H$_2$): |
| | 100 cm$^3$/min (normal) |
| Substrate temp.: | 200° C. |
| Pressure: | 160 Pa (1.2 Torr) |

TABLE 5

| | Layer thickness (μm) |
|---|---|
| Example 3-1, Comparative Example 3-1: | 0.5 |
| Example 3-2, Comparative Example 3-2: | 1.5 |
| Example 3-3, Comparative Example 3-3: | 2.0 |
| Example 3-4, Comparative Example 3-4: | 3.0 |
| Example 3-5, Comparative Example 3-5: | 5.0 |

TABLE 6

| | Fill factor | Changes in photoelectric conversion efficiency by temperature humidity test (efficiency after test/initial efficiency) |
|---|---|---|
| Example: | | |
| 3-1 | 1 | 1.0 |
| 3-2 | 1.01 | 1.0 |
| 3-3 | 1.00 | 1.0 |
| 3-4 | 0.99 | 1.0 |
| 3-5 | 0.98 | 1.0 |
| Comparative Example: | | |
| 3-1 | 0.94 | 0.98 |
| 3-2 | 0.90 | 0.98 |
| 3-3 | 0.85 | 0.95 |
| 3-4 | 0.83 | 0.93 |
| 3-5 | 0.75 | 0.90 |

The fill factor is based on the value found by standardizing as 1 the value of Example 3-1.

TABLE 7

211 Forming conditions:

| | |
|---|---|
| Source gases: | $SiH_4$: 20 cm³/min (normal) |
| | $H_2$: 100 cm³/min (normal) |
| | $PH_3$ (2%-diluted with $H_2$): |
| | 30 cm³/min (normal) |
| Substrate temp.: | 300° C. |
| Pressure: | 133 Pa (1.0 Torr) |

212 Forming conditions:

| | |
|---|---|
| Source gases: | $SiH_4$:$SiF_4$:$H_2$ = 1:1:6 |
| | τ = 0.7 second |
| Substrate temp.: | 400° C. |
| Pressure: | 200 Pa (1.5 Torr) |

213 Forming conditions:

| | |
|---|---|
| Source gases: | $SiH_4$: 10 cm³/min (normal) |
| | $H_2$: 800 cm³/min (normal) |
| | $BF_3$ (2%-diluted with $H_2$): |
| | 100 cm³/min (normal) |
| Substrate temp.: | 200° C. |
| Pressure: | 160 Pa (1.2 Torr) |

TABLE 8

| | High-frequency power density (W/cm³) |
|---|---|
| Example 4-1, Comparative Example 4-1: | 0.05 |
| Example 4-2, Comparative Example 4-2: | 0.01 |
| Example 4-3, Comparative Example 4-3: | 0.1 |
| Example 4-4, Comparative Example 4-4: | 0.5 |
| Example 4-5, Comparative Example 4-5: | 1.0 |
| Example 4-6, Comparative Example 4-6: | 2.0 |
| Example 4-7, Comparative Example 4-7: | 5.0 |

TABLE 9

| | Initial photoelectric conversion efficiency | Peel test | Changes in photoelectric conversion efficiency by temp. humidity test (efficiency after test/initial efficiency) |
|---|---|---|---|
| Example: | | | |
| 4-1 | 1 | A | 1.0 |
| 4-2 | 1.03 | A | 1.0 |
| 4-3 | 1.05 | AA | 1.0 |
| 4-4 | 1.10 | AA | 1.0 |
| 4-5 | 1.12 | AA | 1.0 |
| 4-6 | 1.05 | A | 1.0 |
| 4-7 | 0.98 | A | 1.0 |
| Comparative Example: | | | |
| 4-1 | 0.93 | A | 1.0 |
| 4-2 | 0.95 | A | 1.0 |
| 4-3 | 0.94 | A | 0.98 |
| 4-4 | 0.93 | A | 0.98 |
| 4-5 | 0.85 | B | 0.95 |
| 4-6 | 0.85 | B | 0.95 |
| 4-7 | 0.78 | B | 0.93 |

The initial photoelectric conversion efficiency is based on the value found by standardizing as 1 the value of Example 4-1.

The peel test means that the number of squares having peeled is AA: 0, A: 1 or 2, B: 3 to 10, and C: 11 to 100.

TABLE 10

211 Forming conditions:

| | |
|---|---|
| Source gases: | $SiH_4$: 20 cm³/min (normal) |
| | $H_2$: 100 cm³/min (normal) |
| | $PH_3$ (2%-diluted with $H_2$): |
| | 30 cm³/min (normal) |
| Substrate temp.: | 300° C. |
| Pressure: | 133 Pa (1.0 Torr) |

212 Forming conditions:

| | |
|---|---|
| Source gases: | $SiH_4$:$H_2$ = 1:8 |
| | τ = 0.4 second |
| Substrate temp.: | 250° C. |
| Pressure: | 1,500 Pa (11.3 Torr) |

213 Forming conditions:

| | |
|---|---|
| Source gases: | $SiH_4$: 10 cm³/min (normal) |
| | $H_2$: 800 cm³/min (normal) |
| | $BF_3$ (2%-diluted with $H_2$): |
| | 100 cm³/min (normal) |
| Substrate temp.: | 200° C. |
| Pressure: | 160 Pa (1.2 Torr) |

TABLE 11

| | |
|---|---|
| $SiF_4$ gas (Example 6-1): | $SiF_4$ with 0.1 ppm oxygen |
| $SiF_4$ gas (Example 6-2): | $SiF_4$ with 0.3 ppm oxygen |
| $SiF_4$ gas (Example 6-3): | $SiF_4$ with 0.7 ppm oxygen |
| $SiF_4$ gas (Example 6-4): | $SiF_4$ with 1.0 ppm oxygen |

TABLE 12

| | Example | | | | |
|---|---|---|---|---|---|
| | 4-3 | 6-1 | 6-2 | 6-3 | 6-4 |
| Oxygen concentration in film: (atoms/cm³) | $1.0 \times 10^{18}$ | $1.5 \times 10^{18}$ | $7.0 \times 10^{18}$ | $5.0 \times 10^{19}$ | $7.0 \times 10^{19}$ |
| Initial photoelectric conversion efficiency: | 1 | 1.13 | 1.14 | 1.14 | 1.03 |
| Changes in photoelectric conversion efficiency by temperature humidity test (efficiency after test/initial efficiency): | 1.0 | 1.0 | 1.0 | 1.0 | 0.98 |

TABLE 13

| Distance between conductive substrate and high-frequency power feed section: (mm) | 2 | 3 | 6 | 9 | 15 | 30 | 50 |
|---|---|---|---|---|---|---|---|
| Photoelectric conversion efficiency: | — | 1 | 1.01 | 1.02 | 1.10 | 1.10 | 0.85 |

The respective values are found by standardizing as 1 the value found when the distance between conductive substrate and high-frequency power feed section is 3 mm.

TABLE 14

| Internal pressure of semiconductor-forming reactor 213: (Pa) | | | | | | | |
|---|---|---|---|---|---|---|---|
| 50 | 90 | 100 | 1,000 | 5,000 | 10,000 | 15,000 | 20,000 |
| Photoelectric conversion efficiency: | | | | | | | |
| 1 | 1.15 | 1.30 | 1.33 | 1.30 | 1.25 | 1.20 | 0.93 |
| Peel test: | | | | | | | |
| C | A | AA | AA | AA | A | A | B |
| Temperature humidity test: | | | | | | | |
| 0.70 | 0.90 | 1.0 | 1.0 | 1.0 | 0.95 | 0.95 | 0.80 |

The photoelectric conversion efficiency is based on the value found by standardizing as 1 the value found when the internal pressure of the semiconductor-forming reactor 213 is 50 Pa.

The peel test means that the number of squares having peeled is AA: 0, A: 1 or 2, B: 3 to 10, and C: 11 to 100.

The temperature humidity test is evaluated as the value of (photoelectric conversion efficiency after test)/(photoelectric conversion efficiency before test).

TABLE 15

| Residence time in semiconductor-forming reactors 212 and 213: (sec.) | | | | | | |
|---|---|---|---|---|---|---|
| 0.008 | 0.01 | 0.1 | 1.0 | 3.0 | 10 | 15 |
| Photoelectric conversion efficiency: | | | | | | |
| 1 | 1.30 | 1.38 | 1.43 | 1.40 | 1.35 | 0.87 |
| Peel test: | | | | | | |
| B | A | AA | AA | AA | A | C |
| Temperature humidity test: | | | | | | |
| 0.7 | 0.9 | 1.0 | 1.0 | 1.0 | 1.0 | 0.7 |

The photoelectric conversion efficiency is based on the value found by standardizing as 1 the value found when the residence time in the semiconductor-forming reactors 212 and 213 is 0.008 second.

The peel test means that the number of squares having peeled is AA: 0, A: 1 or 2, B: 3 to 10, and C: 11 to 100.

The temperature humidity test is evaluated as the value of (photoelectric conversion efficiency after test)/(photoelectric conversion efficiency before test).

TABLE 16

| 216 Forming conditions: | |
|---|---|
| Source gases: | $SiH_4$: 20 cm$^3$/min (normal) |
| | $H_2$: 100 cm$^3$/min (normal) |
| | $PH_3$ (2%-diluted with $H_2$): |
| | 50 cm$^3$/min (normal) |
| Substrate temp.: | 300° C. |
| Pressure: | 133 Pa (1.0 Torr) |
| 217 Forming conditions: | |
| Source gases: | $SiH_4$: 300 cm$^3$/min (normal) |
| | $H_2$: 4,000 cm$^3$/min (normal) |
| Substrate temp.: | 300° C. |
| Pressure: | 1,500 Pa (11.3 Torr) |
| 218 Forming conditions: | |
| Source gases: | $SiH_4$: 10 cm$^3$/min (normal) |
| | $H_2$: 800 cm$^3$/min (normal) |
| | $BF_3$ (2%-diluted with $H_2$): |
| | 100 cm$^3$/min (normal) |
| Substrate temp.: | 200° C. |
| Pressure: | 160 Pa (1.2 Torr) |

What is claimed is:

1. A silicon-based film formation process comprising feeding a source gas into a vacuum reactor, and applying a high-frequency power to a high-frequency power feed section installed in the vacuum reactor, to cause plasma to take place to form a silicon-based film by chemical vapor deposition on a substrate placed on an electrode provided at a position opposing the high-frequency power feed section and grounded electrically, wherein the film is formed superimposing a direct-current potential on the high-frequency power to set the potential of the high-frequency power feed section to a potential which is lower by V1 than the ground potential, the V1 satisfying the following expression:

$$|V2| \leq |V1| \leq 50 \times |V2|,$$

where V2 is the potential difference from the ground potential, produced in the electrode in the state the plasma has taken place under the same conditions except that the direct-current potential is not superposed on the high-frequency power and the electrode is brought into a non-grounded state.

2. The silicon-based film formation process according to claim 1, wherein the V1 is within the range of $2 \times |V2| \leq |V1| \leq 30 \times |V2|$.

3. The silicon-based film formation process according to claim 1, wherein a direct-current power source is connected through a choke coil onto a circuit which connects the high-frequency power feed section and a high-frequency power source.

4. The silicon-based film formation process according to claim 1, wherein the substrate is so set as to serve also as the electrode provided at a position opposing the high-frequency power feed section and grounded electrically.

5. The silicon-based film formation process according to claim 4, wherein the film is formed by a roll-to-roll method.

6. The silicon-based film formation process according to claim 1, wherein the high-frequency power has a frequency of from 20 MHz to 500 MHz.

7. The silicon-based film formation process according to claim 6, wherein the frequency of the high-frequency power is from 30 MHz to 150 MHz.

8. The silicon-based film formation process according to claim 1, wherein the silicon-based film is a silicon-based film containing a crystal phase.

9. The silicon-based film formation process according to claim 8, wherein the silicon-based film containing a crystal phase contains a region in which the diffraction intensity of the (220)-plane, measured by X-ray or electron-ray diffraction of the crystal phase, is in a proportion of 80% or more with respect to the total diffraction intensity.

10. The silicon-based film formation process according to claim 1, wherein the source gas contains at least one of silicon hydride gas and silicon fluoride gas, and hydrogen gas.

11. The silicon-based film formation process according to claim 1, wherein the distance between the high-frequency power feed section and the substrate is from 3 mm to 30 mm.

12. The silicon-based film formation process according to claim 1, wherein the silicon-based film is formed under a pressure of from 100 Pa (0.75 Torr) to 5,000 Pa (37.5 Torr).

13. The silicon-based film formation process according to claim 1, wherein, in forming the silicon-based film, the source gas is fed at a residence time $\tau$ of from 0.01 second to 10 seconds, provided that;

$$\tau = 592 \times V \times P/Q,$$

where V is the volume (m$^3$) of a discharge space in which the plasma is taking place, P is the internal pressure (Pa) of the discharge space, and Q is the flow rate (cm$^3$/min) of the source gas.

14. The silicon-based film formation process according to claim 13, wherein the residence time $\tau$ of the source gas in forming the silicon-based film is from 0.1 second to 3 seconds.

15. The silicon-based film formation process according to claim 1, wherein, in forming the silicon-based film, the high-frequency power is applied at a density of from 0.01 W/cm$^3$ to 2 W/cm$^3$.

16. The silicon-based film formation process according to claim 15, wherein the frequency power density in forming the silicon-based film is from 0.1 W/cm$^3$ to 1 W/cm$^3$.

17. The silicon-based film formation process according to claim 1, wherein the silicon-based film contains at least one of oxygen atoms, carbon atoms and nitrogen atoms, which are in a total content of from $1.5 \times 10^{18}$ atoms/cm$^3$ to $5.0 \times 10^{19}$ atoms/cm$^3$.

18. The silicon-based film formation process according to claim 1, wherein the silicon-based film contains fluorine atoms in a content of from $1.0 \times 10^{19}$ atoms/cm$^3$ to $2.5 \times 10^{20}$ atoms/cm$^3$.

19. A silicon-based film formation system comprising:

a vacuum reactor;

a gas feed pipe for feeding a source gas into the vacuum reactor;

a high-frequency power feed section installed in the vacuum reactor;

a high-frequency power source for applying a high-frequency power to the high-frequency power feed section;

an electrode provided at a position opposing the high-frequency power feed section; and a direct-current power source for superposing a direct-current potential on the high-frequency power applied to the high-frequency power feed section;

the electrode being electrically grounded; and the potential of the high-frequency power feed section being so set as to be a potential which is lower by V1 than the ground potential; the V1 satisfying the following expression:

$$|V2| \leq |V1| \leq 50 \times |V2|,$$

where V2 is the potential difference from the ground potential, produced in the electrode in the state the plasma has taken place under the same conditions except that the direct-current potential is not superposed on the high-frequency power and the electrode is brought into a non-grounded state.

20. The silicon-based film formation system according to claim 19, wherein the V1 is within the range of $2 \times |V2| \leq |V1| \leq 30 \times |V2|$.

21. The silicon-based film formation system according to claim 19, wherein the direct-current power source is connected through a choke coil onto a circuit which connects the high-frequency power feed section and the high-frequency power source.

22. The silicon-based film formation system according to claim 19, wherein the substrate is so set as to serve also as the electrode provided at a position opposing the high-frequency power feed section and grounded electrically.

* * * * *